United States Patent

Takahashi et al.

[11] Patent Number: 6,111,421
[45] Date of Patent: Aug. 29, 2000

[54] PROBE METHOD AND APPARATUS FOR INSPECTING AN OBJECT

[75] Inventors: Shigeaki Takahashi, Yamanashi-ken; Yukihiko Fukasawa, Nirasaki, both of Japan

[73] Assignee: Tokyo Electron Limited, Tokyo, Japan

[21] Appl. No.: 09/168,382

[22] Filed: Oct. 8, 1998

[30] Foreign Application Priority Data

Oct. 20, 1997 [JP] Japan .................................. 9-304833
Nov. 19, 1997 [JP] Japan .................................. 9-334908

[51] Int. Cl.$^7$ .................................................. G01R 31/02
[52] U.S. Cl. .......................................... 324/758; 324/760
[58] Field of Search .................................. 324/756, 758, 324/760

[56] References Cited

U.S. PATENT DOCUMENTS 5,517,126  5/1996  Yamaguchi ........................... 324/754
5,912,555  6/1999  Akaike et al. ........................ 324/758
5,945,834  8/1999  Nakata et al. ....................... 324/758

FOREIGN PATENT DOCUMENTS 5-347336  12/1993  Japan .
6-97243   4/1994   Japan .

*Primary Examiner*—Safet Metjahic
*Assistant Examiner*—James C. Kerveros
*Attorney, Agent, or Firm*—Oblon, Spivak, McClelland, Maier & Neustadt, P.C.

[57] ABSTRACT

A probe method is disclosed which inspects the electrical characteristics of an object to be inspected (wafer W) by bringing the electrodes of the object to be inspected placed on a main chuck and probes of a probe card into contact with each other. The main chuck is movable in the X, Y, Z, and θ directions and heated to a predetermined inspection temperature. The main chuck retreats to a position separated from the inspection position during high-temperature inspection. The time (retreat time) during which the main chuck stays retreated is calculated by a retreat time calculating mechanism. A preheat execute determination mechanism determines whether the probe card and probes are to be preheated on the basis of the retreat time. When it is determined that preheating is necessary, a preheat time calculation mechanism calculates the preheat execute time. Preheating is executed during the preheat execute time determined by a preheat end determination mechanism, and misalignment of the probes is corrected.

25 Claims, 11 Drawing Sheets

PROBE METHOD AND APPARATUS FOR INSPECTING AN OBJECT

BACKGROUND OF THE INVENTION

The present invention relates to a probe method and apparatus for inspecting the electrical characteristics of an object to be inspected and, more particularly, to a probe method and apparatus for inspecting the electrical characteristics of an inspection item of an object to be inspected at a predetermined temperature.

A typical example of an inspection item of an object to be inspected includes integrated circuits (to be referred to as chips hereinafter) formed on a silicon wafer (to be referred to as a wafer W hereinafter). The inspection item of the present invention is not limited to the chips but also includes any electronic appliances and components the electrical characteristics of which can be inspected by so-called probing.

FIG. 14 shows an example of a conventional probe apparatus 10. Referring to FIG. 14, each object to be inspected (to be referred to as a wafer W hereinafter) stored in a cassette C in a loader chamber 11 is conveyed to a prober chamber 12 that inspects the wafer W. The prober chamber 12 and loader chamber 11 are controlled by a controller 13. A display 14 also serves as an operation panel for controlling the controller 13.

A wafer convey mechanism 15 and a sub chuck 16 are disposed in the loader chamber 11. While the wafer convey mechanism 15 conveys the wafer W from the cassette C to the prober chamber 12, the wafer W is pre-aligned by the sub chuck 16 with reference to its orientation flat. A wafer recognition mechanism (not shown) using a bar code reader, an OCR, and the like is arranged in the loader chamber 11. This wafer recognition mechanism reads a bar code or character information indicated on part of the wafer W.

A main chuck 20 on which the wafer W is placed and controlled to a predetermined temperature is arranged in the prober chamber 12. The main chuck 20 can be moved in the X, Y, Z, and θ directions by an X-Y (stage) moving mechanism 18, an elevating mechanism (not shown), and the like. A probe card 22, the main chuck 20, and an alignment mechanism 21 are placed in the prober chamber 12. The probe card 22 has probes or probe needles for electrically inspecting the wafer W. The alignment mechanism 21 accurately aligns the wafer W placed on the main chuck 20 with the probes. For example, the alignment mechanism 21 has a lower CCD camera 21D for image recognition, an alignment bridge 21B on which an upper CCD camera 21A is set to face downward, and a pair of guide rails 21C for reciprocally moving the alignment bridge 21B in the Y direction. Although FIG. 14 shows only the upper CCD camera 21A and does not show the lower CCD camera 21D, the lower CCD camera 21D is mounted on, e.g., the main chuck.

When inspecting wafers W, the wafer convey mechanism 15 extracts one wafer W from the cassette C in the loader chamber 11. While being conveyed by the wafer convey mechanism 15 toward the main chuck 20, the wafer W is pre-aligned by the sub chuck 16. Along with this, as shown in FIG. 12A, a plurality of probes or probe needles 22A are aligned by the alignment mechanism 21 and main chuck 20. After that, the alignment bridge 21B moves to the probe center and the main chuck 20 moves in the X, Y, and Z directions, to obtain a reference position in the prober chamber 12 by using the upper and lower CCD cameras 21A and 21D and a target 21E which is provided to the main chuck 20 and can move forward/backward, as shown in FIG. 12B. Then, the wafer convey mechanism 15 transfers the wafer W from the loader chamber 11 onto the main chuck 20 in the prober chamber 12. The main chuck 20 moves in the X, Y, and θ directions, as shown in FIG. 12C, to align the wafer W by using the CCD camera 21A. The main chuck 20 moves to move a chip, which is to be inspected first, to immediately under the probe card 22. The main chuck 20 moves upward in the Z direction from the current position to bring the probes 22A and the electrode pads of the chip into contact with each other. With the main chuck 20 over-driven, inspection of the electrical characteristics of the wafer W is started.

The probe card 22 is fixed in the opening at the center of a head plate through an insert ring. The head plate is arranged on the upper surface of the prober chamber 12 and can be opened/closed. A test head (not shown) is movably disposed on the upper surface of the prober chamber 12. The test head electrically connects the probes of the probe card 22 and a tester (not shown) with each other, and receives a predetermined signal from the tester and transmits it to the electrodes of the chip formed on the wafer W through the probes. The electrical characteristics of the chip are sequentially inspected by the tester.

To inspect the electrical characteristics of the chip at a high temperature of, e.g., 180° C., the main chuck 20 and the wafer W are heated to a predetermined high temperature by a heating mechanism in the main chuck 20. The electrode pads of the chip and the probes are brought into electrical contact with each other to inspect the electrical characteristics of the chip. To inspect the electrical characteristics of the wafer W at a low temperature of, e.g., –50° C., the main chuck 20 and the wafer W are cooled to a predetermined low temperature by a cooling mechanism in the main chuck 20. The electrode pads of the chip and the probes are brought into electrical contact with each other to inspect the electrical characteristics of the chip. In the case of low-temperature inspection as well, the chip is cooled to a predetermined low temperature, in the same manner as in high-temperature inspection, and its electrical characteristics are inspected.

Following alignment of the electrode pads formed on the wafer W and the probes of the probe card 22 with each other, when inspection is to be performed at a high temperature of, e.g., 180° C., the probe card 22 is gradually heated by radiation heat from the main chuck 20 and thermally expands. Then, the coordinate positions of the probes on the probe card 22 gradually deviate from the coordinate positions obtained in pre-alignment. In the case of low-temperature inspection, the probe card shrinks due to the low temperature, and its coordinate position also deviates.

FIG. 13 shows an example of misalignment (positional displacement) of the probe in the Z direction in the high-temperature inspection. In FIG. 13, the distal end of the probe shifts upward in the Z direction for several hours since the start of measurement. The probes and the electrode pads of the inspection item cannot accordingly come into correct contact with each other, but misalignment or needle-pressure abnormality occurs in the probe to degrade the inspection reliability. This misalignment of the distal end of the probe occurs not only in high-temperature inspection but also in low-temperature inspection. Furthermore, this positional displacement occurs while the probe card 22 and the probes reach a predetermined inspection temperature, e.g., when measurement is to be newly started and when interrupted measurement is to be resumed.

In the era of 12-inch wafers to come, not only the wafer size will increase but also the chip pattern will shrink and the pitch among the electrode pads of the chip will decrease. When a plurality of (e.g., 32) chips are to be inspected simultaneously, the size of the probe card increases and also the number of probes increases to decrease the pitch among the probes, making the thermal influence described above more and more conspicuous. For this reason, the probe card must be preheated before inspection to prevent thermal influence as much as possible. A considerable amount of time is required for this preheating, leading to a great decrease in throughput.

During inspection, sometimes inspection is interrupted and the main chuck is separated from the inspection position. For example, needle marks are checked or tips of the probes are polished in the course of inspection. In this case, since the main chuck 20 is separated from the over-driven position described above, the temperature of the probe card and probes drops gradually. When inspection is resumed, the positions of the probes gradually deviate from the coordinate positions obtained during probe alignment, as described above. In order to avoid this misalignment, if the probe card and probes are preheated manually as required, the throughput suffers greatly.

BRIEF SUMMARY OF THE INVENTION

It is an object of the present invention to provide a highly reliable probe method and apparatus which, during inspection of an object to be processed, reliably bring probes and the electrodes of an object to be inspected into contact with each other with an appropriate contact pressure.

It is another object of the present invention to correct misalignment of probes that takes place in the process in which a probe card and the probes reach a predetermined inspection temperature.

It is still another object of the present invention to correct the positional displacement of the probes that takes place when inspection performed at a predetermined temperature is interrupted and the temperature of the probe card and probes drops.

It is still another object of the present invention to automatically preheat a probe card, even when the main chuck 20 separates from the over-driven position described above during high-temperature inspection and the temperature of the probe card and probes accordingly drops, so that the reliability of inspection improves as well as the throughput.

It is still another object of the present invention to correct misalignment of the pin points of the probes, that takes place in high- or low-temperature inspection, in the process in which the probe card 22 and probes are gradually heated or cooled by the main chuck 20 to reach a predetermined inspection temperature.

According to the present invention, there is provided a probe method comprising the steps of:

placing an object to be inspected having a plurality of inspection items on a main chuck which is movable in X, Y, Z, and θ directions and controlled to a predetermined high temperature;

aligning the object to be inspected and probes provided to the probe card with each other;

indexing the main chuck to set at least one inspection item of the inspection items of the object to be inspected at an inspection preparation position;

contacting electrodes of at least one of the inspection items and the probes electrically with each other by moving the main chuck toward the probe card; and measuring electrical characteristics of the inspection item with a tester connected to the probes, the indexing step, the contacting step, and the measuring step being repeatedly performed to inspect successively the electrical characteristics of predetermined inspection items of the inspection items.

According to the first aspect of the present invention, there is provided a probe method wherein the main chuck is controlled to a predetermined high temperature, and the contacting step comprises the steps of detecting that a temperature of the probe card and the probes has fallen below the predetermined high temperature if the main chuck retreats from the predetermined inspection preparation position in a direction to separate from the probe card, and correcting misalignment of the probes resulting from the temperature fall when it is detected that the temperature of the probe card and the probe has fallen below the predetermined high temperature.

According to the second aspect of the present invention, there is provided a probe method according to the first aspect, wherein the step of detecting that the temperature of the probe card and the probes has fallen below the predetermined high temperature comprises the step of detecting a time during which the main chuck continues to retreat from the predetermined inspection preparation position in the direction to separate from the probe card, and determining that the temperature of the probe card and the probes has fallen below the predetermined high temperature on the basis of the retreat time.

According to the third aspect of the present invention, there is provided a probe method according to the first aspect, wherein the step of detecting that the temperature of the probe card and the probes has fallen below the predetermined high temperature comprises the step of detecting a time during which the main chuck continues to retreat from the predetermined inspection preparation position in the direction to separate from the probe card, and determining that the temperature of the probe card and the probes has fallen below the predetermined high temperature on the basis of the retreat time, and the step of correcting misalignment of the probes comprises the steps of setting a preheat execute time, during which the probe card and the probes are to be heated, on the basis of the retreat time, and heating the probe card and the probes during the preheat execute time.

According to the fourth aspect of the present invention, there is provided a probe method according to the third aspect, wherein the step of correcting misalignment of the probes comprises the steps of setting the preheat execute time, during which the probe card and the probes are to be heated, on the basis of the retreat time, heating the probe card and the probes during the preheat execute time, and aligning the inspection items of the object to be inspected placed on the main chuck and the probes with each other by controlling a position of the main chuck after the heating step.

According to the fifth aspect of the present invention, there is provided a probe method according to the third aspect, wherein the step of setting the preheat execute time, during which the probe card and the probes are to be heated, on the basis of the retreat time, comprises the step of setting the preheat execute time on the basis of the retreat time within a range not exceeding a time required for heating the probe card from room temperature to the predetermined high temperature.

According to the sixth aspect of the present invention, there is provided a probe method comprising the steps of:

placing an object to be inspected, having a plurality of inspection items, on a main chuck which is movable in X, Y, Z, and θ directions and controlled to a predetermined temperature;

aligning the object to be inspected and probes provided to said probe card with each other;

indexing said main chuck to set at least one inspection item of the inspection items of the object to be inspected at an inspection preparation position;

contacting electrodes of at least one of the inspection items and said probes electrically with each other by moving said main chuck toward said probe card; and measuring electrical characteristics of the inspection item with a tester connected to said probes, the indexing step, the contacting step, and the measuring step being repeatedly performed to inspect successively the electrical characteristics of predetermined inspection items of the inspection items, wherein the step of correcting misalignment of said probe card and said probes is performed prior to each contacting step which is performed repeatedly in a process during which said probe card and said probes are controlled to reach the predetermined temperature.

According to the seventh aspect of the present invention, there is provided a probe method according to the sixth aspect, wherein the correcting step of correcting misalignment of the probe card and the probes comprises the steps of correcting misalignment of the probe card and the probes prior to each contacting step which is performed repeatedly in the process during which the probe card and the probes are controlled to reach the predetermined temperature, and each contacting step comprises the step of correcting misalignment of the probe card and the probes in the Z direction during the process by correcting a distance the main chuck is to move toward the probe card.

According to the eighth aspect, there is provided a probe method according to the sixth aspect, wherein the step of correcting misalignment of the probes comprises the steps of determining whether misalignment of the probe card and the probes is to be corrected prior to inspection of the first inspection item, correcting misalignment in accordance with a determination made in the determining step, determining whether misalignment of the probe card and the probes is to be corrected, prior to inspection of each of a second and following inspection items, on the basis of misalignment correction end conditions, and correcting misalignment of the probe card and the probes in accordance with a determination made in the second determining step.

According to the ninth aspect of the present invention, there is provided a probe method according to the eighth aspect, wherein the steps of determining whether misalignment of the probe card and the probes is to be corrected prior to inspection of the first inspection item, and determining whether misalignment of the probe card and the probes is to be corrected, prior to inspection of each of a second and following inspection items, on the basis of misalignment correction end conditions, comprise making determination in accordance with whether the temperature has reached the predetermined temperature by detecting the temperature of the probe card and the probes.

According to the tenth aspect of the present invention, there is provided a probe method according to the eighth aspect, wherein the misalignment correction end conditions are set on the basis of determination as to whether an amount of displacement from positions of tips of the probes in the last inspection to current positions of the tips falls within an allowable range.

According to the eleventh aspect of the present invention, there is provided a probe method according to the eighth aspect, wherein the misalignment correction end conditions are set on the basis of determination as to whether a time required for inspection until the last time exceeds a minimum inspection time required for the probe card and the probes to reach the predetermined temperature.

According to the twelfth aspect of the present invention, there is provided a probe method according to the eighth aspect, wherein the misalignment correction end conditions are set on the basis of determination as to whether an amount of displacement from positions of tips of the probes in the last inspection to current positions of the tips falls within an allowable range, determination as to whether a time required for inspection until the last time exceeds a minimum inspection time required for the probe card and the probes to reach the predetermined temperature, and the number of times it is determined in the above two determinations simultaneously and continuously that the amount of displacement of the positions of the tips of the probes falls within the allowable range and that the time required for inspection until the last time exceeds the minimum inspection time.

According to the present invention, there is also provided a probe apparatus (to be referred to as the related probe apparatus) comprising:

a prober chamber for inspecting electrical characteristics of an object to be inspected;

a probe card arranged on an upper surface of the prober chamber and having probes;

a main chuck arranged under the probe card in the prober chamber, movable in X, Y, Z, and θ directions, and set to a predetermined high temperature, to place the object to be inspected thereon;

an alignment mechanism for aligning the object to be inspected placed on the main chuck and the probes with each other;

an indexing mechanism for indexing the main chuck to set at least one inspection item of inspection items of the object to the inspected at an inspection preparation position;

a main chuck moving mechanism for moving the main chuck toward the probe card, thereby bringing electrodes of the object to be inspected placed on the main chuck and the probes into electrical contact with each other; and a tester connected to the probes to measure the electrical characteristics of the inspection item, indexing of the inspection item, electrical contact between the electrodes of the object to be inspected and the probes, and measurement of the electrical characteristics of the inspection item being repeatedly performed.

According to the thirteenth aspect of the present invention, there is provided the related probe apparatus wherein the main chuck moving mechanism comprises
a temperature fall detection mechanism for detecting that a temperature of the probe card and the probes has fallen below the predetermined high temperature if the main chuck retreats from a predetermined inspection preparation position in a direction to separate from the probe card, and
a misalignment correction mechanism for correcting, when it is detected that the temperature of the probe card and the probes has fallen below the predetermined high temperature, misalignment of the probes resulting from the temperature fall.

According to the fourteenth aspect of the present invention, there is provided the probe apparatus according to the thirteenth aspect, wherein the temperature fall detection mechanism comprises a retreat time detection mechanism for detecting a time during which the main chuck continues to retreat from the predetermined inspection preparation position in the direction to separate from the probe card, and
a temperature fall determination mechanism for determining that the temperature of the probe card and the probes has fallen below the predetermined temperature on the basis of the retreat time.

According to the fifteenth aspect of the present invention, there is provided a probe apparatus according to the thirteenth aspect, wherein the temperature fall detection mechanism comprises
a retreat time detection mechanism for detecting a time during which the main chuck continues to retreat from the predetermined inspection preparation position in the direction to separate from the probe card, and
a temperature fall determination mechanism for determining that the temperature of the probe card and the probes has fallen below the predetermined temperature on the basis of the retreat time, and
the misalignment correction mechanism comprises
a preheat execute time setting mechanism for setting a preheat execute time during which the probe card and the probes are to be heated on the basis of the retreat time, and
a preheat execute mechanism for heating the probe card and the probes during the preheat execute time.

According to the sixteenth aspect of the present invention, there is provided a probe method according to the fifteenth aspect, wherein the misalignment correction mechanism comprises a preheat execute time setting mechanism for setting a preheat execute time during which the probe card and the probes are to be heated on the basis of the retreat time,
a preheat execute mechanism for heating the probe card and the probes during the preheat execute time, and
an alignment mechanism for controlling the main chuck after the probe card and the probes are heated to the predetermined high temperature by the preheat execute mechanism, thereby aligning inspection items of the object to be inspected placed on the main chuck and the probes with each other.

According to the seventeenth aspect of the present invention, there is provided a probe apparatus according to the fifteenth aspect, wherein the preheat execute time setting mechanism sets the preheat execute time on the basis of the retreat time within a range not exceeding a time required for heating the probe card from room temperature to the predetermined high temperature.

According to the eighteenth aspect of the present invention, there is provided the wherein the main chuck is set at a predetermined temperature, and
either one of the alignment mechanism and the main chuck moving mechanism comprises a card contact correction processing mechanism for correcting misalignment of the probe card and the probes prior to each electrical contact which is performed repeatedly in a process during which the probe card and the probes are controlled to reach the predetermined temperature.

According to the nineteenth aspect of the present invention, there is provided a probe apparatus according to the eighteenth aspect, wherein the card contact correction processing mechanism comprises a correction mechanism provided to the alignment mechanism to correct misalignment of the probe card and the probes in the X, Y, and θ directions prior to each electrical contact which is performed repeatedly in the process during which the probe card and the probes are controlled to reach the predetermined temperature, and
a correction mechanism provided to the main chuck moving mechanism to correct misalignment of the probe card and the probes in the Z direction prior to each electrical contact which is performed repeatedly during the process.

According to the twentieth aspect of the present invention, there is provided a probe apparatus according to the eighteenth aspect, wherein the card contact correction processing mechanism comprises a card contact correction setting mechanism for determining whether misalignment of the probe card and the probes is to be corrected prior to inspection of the first inspection item,
a misalignment correction end condition setting mechanism for setting misalignment correction end conditions serving as a criterion concerning whether correction of misalignment is to be ended prior to inspection of each of a second and following inspection items,
a misalignment correction condition storage mechanism for storing a preset content set by the card contact correction setting mechanism and the misalignment correction end condition setting mechanism, and
a card contact correction processing mechanism for correcting misalignment of the probe card and the probes in accordance with the preset content stored in the misalignment correction condition storage mechanism.

According to the twenty-first aspect of the present invention, there is provided a probe apparatus according to the twentieth aspect, wherein the card contact correction processing mechanism has a misalignment correction execute processing mechanism for checking current positions of the probe card and the probes prior to performing inspection of each of second and following inspection items and correcting misalignment of the probes in accordance with a check content.

According to the twenty-second aspect of the present invention, there is provided a probe apparatus according to the twentieth aspect, wherein the misalignment correction end conditions are set on the basis of determination as to whether an amount of displacement from positions of the tips of the probes in the last inspection to current positions of the tips falls within an allowable range.

According to the twenty-third aspect of the present invention, there is provided a probe apparatus according to the twentieth aspect, wherein the misalignment correction end conditions are set on the basis of determination as to whether a time required for inspection until the last time exceeds a minimum inspection time required for the probe card and the probes to reach the predetermined temperature.

According to the twenty-fourth aspect of the present invention, there is provided a probe apparatus according to the twentieth aspect, wherein the misalignment correction end conditions are set on the basis of determination as to whether an amount of displacement from positions of the tips of the probes in the last inspection to current positions of the tips falls within an allowable range, determination as to whether a time required for inspection until the last time exceeds a minimum inspection time required for the probe card and the probes to reach the predetermined temperature, and the number of times it is determined in the above two determinations simultaneously and continuously that the amount of displacement of the positions of the tips of the probes falls within the allowable range and that the time required for inspection until the last time exceeds the minimum inspection time.

According to the twenty-fifth aspect of the present invention, there is provided a probe apparatus according to the twentieth aspect, wherein the card contact correction setting mechanism and the misalignment correction end condition setting mechanism comprise a sensor for detecting the temperature of the probe card and the probes, and a mechanism for determining whether misalignment is to be corrected on the basis of the detected temperature.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The preferred embodiment of the present invention will be described with reference to FIGS. 1 to 5.

Figure 1:
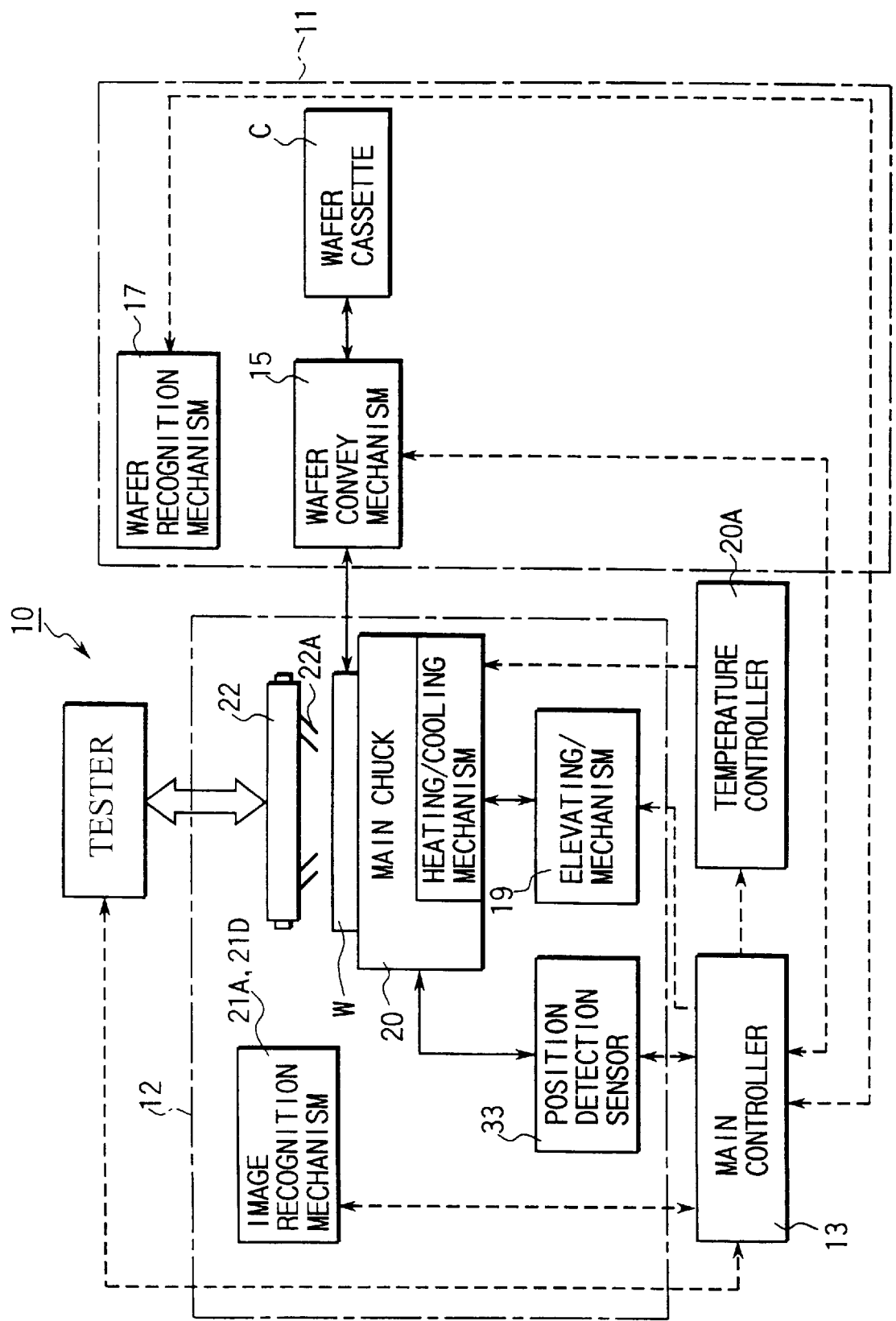
FIG. 1 is a block diagram showing the arrangement of a probe apparatus according to the present invention.
Figure 14:
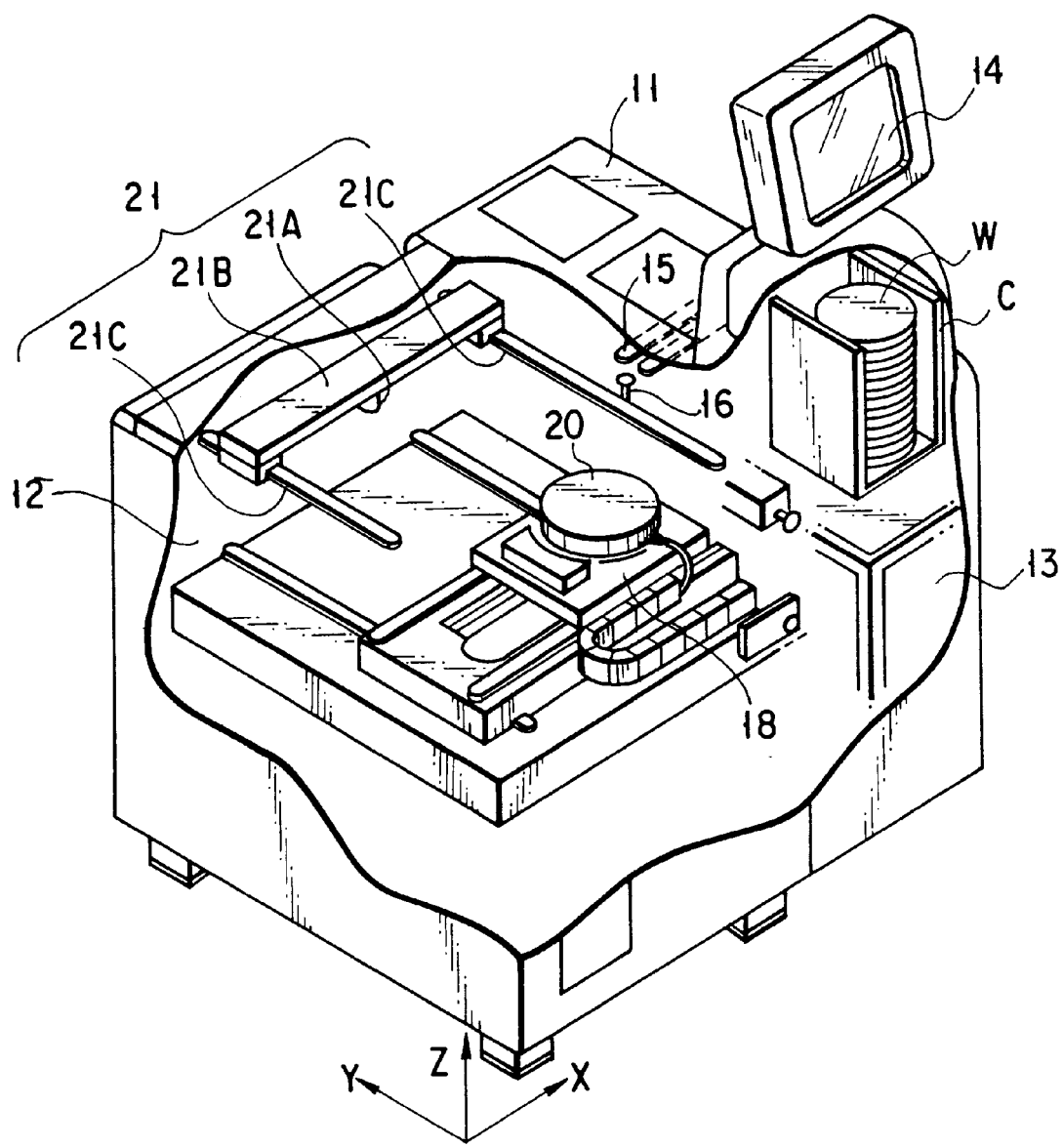
FIG. 14 is a partially cutaway perspective view of a conventional probe apparatus.

A probe apparatus 10 according to a preferable embodiment of the present invention basically has an arrangement similar to that of a conventional probe apparatus shown in FIG. 14. As shown in, e.g., FIG. 1, the probe apparatus 10 has a loader chamber 11, a prober chamber 12, and various types of controllers 13 and 20A. A wafer recognition mechanism 17 is set in the loader chamber 11 to recognize the lot number and the like of a wafer W. Image recognition mechanisms 21A and 21D, e.g., CCD cameras, constructing an alignment mechanism are set in the prober chamber 12. The image recognition mechanisms 21A and 21D respectively image-recognize the surface of the wafer W and the probes of a probe card 22, and the electrode pads of the wafer W and the probes corresponding to them are aligned. A main chuck 20 is heated or cooled to a predetermined inspection temperature under the control of the main controller 13 or temperature controller 20A. FIG. 1 shows a state wherein the probe card 22 is mounted in an insert ring.

Figure 2:
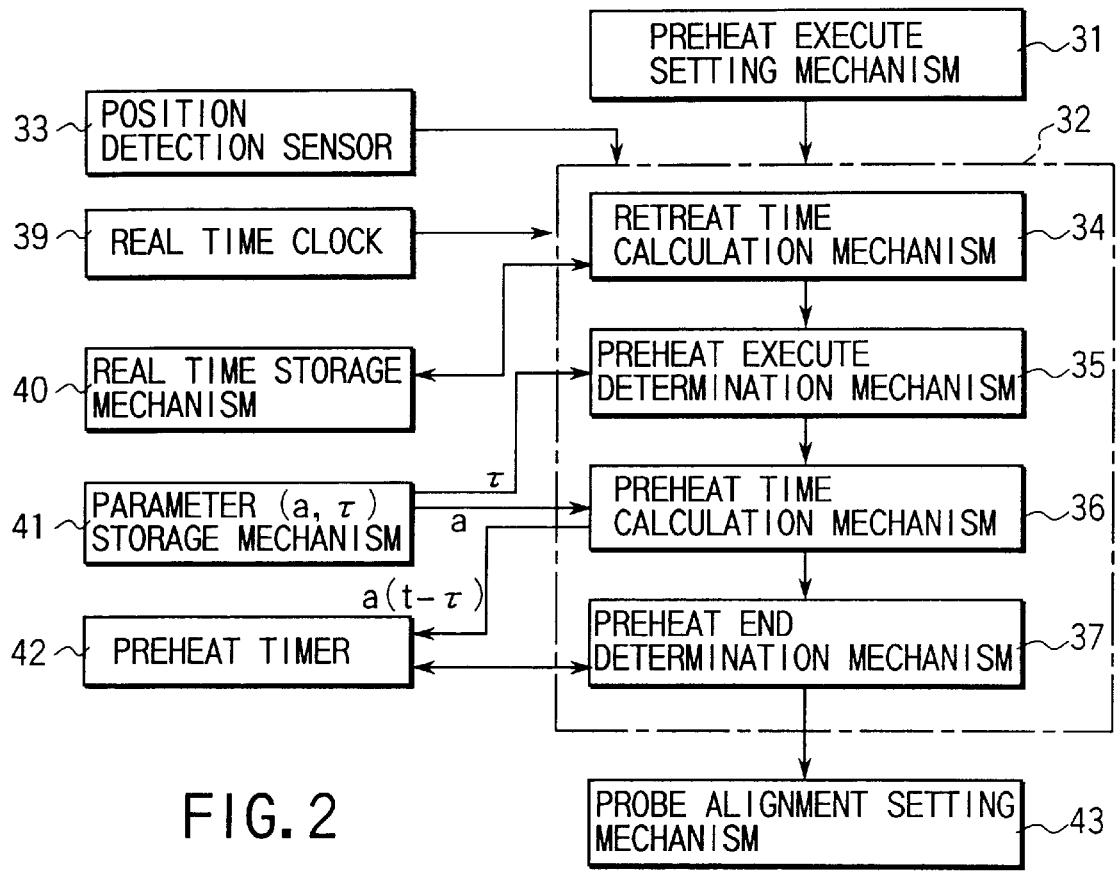
FIG. 2 is a functional block diagram showing the main part of the CPU of the probe apparatus shown in FIG. 1.

The main part of the CPU of the probe apparatus 10 of this embodiment will be described with reference to FIG. 2. The CPU has a preheat execute setting mechanism 31 and a preheat execute mechanism 32 for preheating the probe card 22 with the main chuck 20. The preheat execute setting mechanism 31 sets whether preheating is to be executed. Whether preheating is to be executed is set by, e.g., touching the screen of a display 14. If execution of preheating is set, when the main chuck 20 retreats to a position lower than the inspection position during high-temperature inspection, the preheat execute mechanism 32 is actuated in accordance with a predetermined program, and preheating is automatically executed under the conditions to be described later. A position detection sensor 33 for detecting the height of the main chuck 20 is set in the prober chamber 12. The position detection sensor 33 constantly monitors the height of the main chuck 20. When the main chuck 20 moves downward to a position lower than a predetermined height, the position detection sensor 33 transmits a signal indicating this to the controller 13.

The preheat execute mechanism 32 will be described with reference to FIG. 2. The preheat execute mechanism 32 has a retreat time calculation mechanism 34, a preheat execute determination mechanism 35, a preheat time calculation mechanism 36, and a preheat end determination mechanism 37. The retreat time calculation mechanism 34 calculates the retreat time of the main chuck 20 on the basis of the detection result of the position detection sensor 33. The preheat execute determination mechanism 35 determines whether preheating is necessary on the basis of the calculated retreat time. When the preheat execute determination mechanism 35 determines that preheating is necessary, the preheat time calculation mechanism 36 calculates the preheat execute time on the basis of the retreat time and the type of probe card 22. The preheat end determination mechanism 37 confirms if the main chuck 20 has been preheated during the preheat execute time. These mechanisms can be actuated in accordance with a preheat program. The retreat time calculation mechanism 34, the preheat execute determination mechanism 35, the preheat time calculation mechanism 36, and the preheat end determination mechanism 37 can be formed as a part of a central processing unit (CPU) 38 of the controller 13.

An inspection preparation position is a position farther from an object to be processed than a position where the probes come into contact with the object to be processed to inspect it. For example, the inspection preparation position can be a position from where the main chuck moves in the X and Y directions to index the object to be processed. The retreat time of the main chuck 20 is a time since the main chuck 20 reaches a position separated from the probes until it returns toward the probes from this separated position.

This retreat time is measured by a real time clock 39 of the controller 13 on the basis of a signal from the position detection sensor 33, and a measurement start time point until a measurement end time point are sequentially stored in a real time storage mechanism 40 as required. The retreat time calculation mechanism 34 calculates the retreat time of the main chuck 20 on the basis of the measurement start time point and measurement end time point stored in the real time storage mechanism 40. When the retreat time is calculated by the retreat time calculation mechanism 34, the preheat execute determination mechanism 35 determines whether the probe card 22 and the probes are to be preheated on the basis of the calculated retreat time.

The determination criterion of the preheat execute determination mechanism 35 is the temperature of the probe card 22. Namely, even when the main chuck 20 is separated from the probe card 22, if it returns to the inspection position soon and the retreat time is short, the probe card 22 undergoes little temperature drop. In this case, the probes 22A shift little from the original positions, and no problem occurs at all if inspection is resumed without preheating the probes 22A. Accordingly, the preheat execute determination mechanism 35 determines whether preheating is necessary by referring, as the reference time, to a maximum, predetermined retreat time, with which no problem occurs if high-temperature inspection is resumed after the main chuck 20 retreats.

This reference time can be determined in advance in accordance with the type and material of probe card 22, and the like. If the retreat time of the main chuck 20 falls within the reference time, the preheat execute determination mechanism 35 determines that preheating is unnecessary. If the retreat time exceeds the reference time, the preheat execute determination mechanism 35 determines that preheating is necessary.

Figure 3:
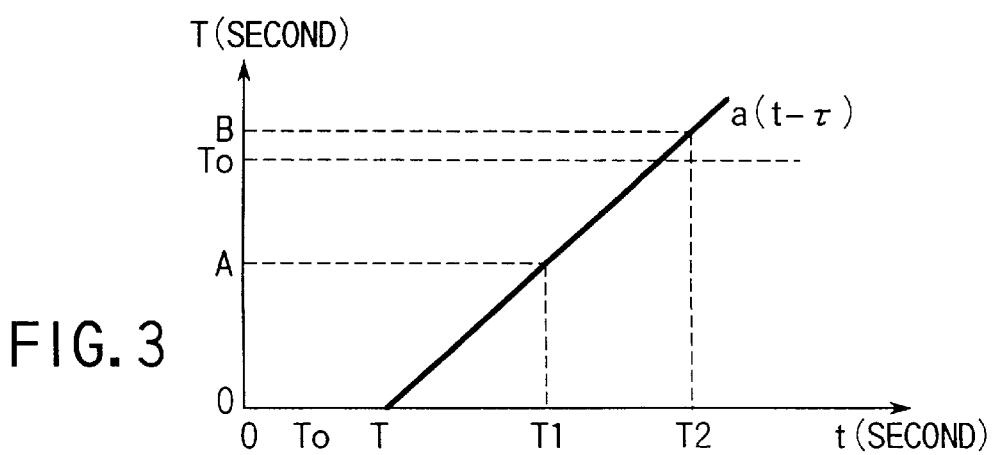
FIG. 3 is a graph showing the preheat operation in a probe method according to the present invention.

When the preheat execute determination mechanism 35 determines that preheating is necessary, the preheat time calculation mechanism 36 calculates the preheat execute time on the basis of the determination result and in accordance with the type of probe card 22. Preheat execute time T is given by:

$$T = a(t - \tau)$$

where t is the retreat time, $\tau$ is the reference time, and a is a time coefficient determined by the type of main chuck 20. This relationship is shown in FIG. 3. A and $\tau$ of this equation are prestored in a parameter storage mechanism 41 of the controller 13. For example, a value between 0 and 99 is assigned to a, and a value of 30 seconds is assigned to $\tau$. $\tau$ is set to 30 seconds for the following reason. When probe alignment is performed after preheating, probe alignment may take 30 seconds. If probe alignment takes 30 seconds or more, preheating must be performed again, leading to preheat and alignment processes that must be repeated permanently.

If the calculated preheat execute time T exceeds the maximum preheat time, preheating is executed with the maximum preheat time. The maximum preheat time refers to the time required until the probe card 22 is heated to the inspection temperature from a state wherein it is not heated at all, like at the onset of inspection. In FIG. 3, T0 indicates the maximum preheat time, and B indicates the preheat execute time calculated when the main chuck 20 separated from the probe card 22 for time t2. Since the preheat execute time B exceeds the maximum preheat time T0, the preheat execute time is set to the maximum preheat time T0.

When the preheat execute time is calculated in the above manner, it is set in a preheat timer 42 through the CPU 38. The preheat end determination mechanism 37 constantly monitors the preheat timer 42. End of preheating is determined on the basis of a time-up signal from the preheat timer 42.

Sometimes probe alignment must be performed after preheating. Whether probe alignment is to be executed is set by a probe alignment setting mechanism 43 by using the display screen of the display 14, in the same manner as the setting operation with the preheat execute setting mechanism 31. When execution of probe alignment is set, after preheating is ended, the position of the main chuck 20 is controlled on the basis of the difference from the predetermined initial position of probes 22A, thereby performing probe alignment. This probe alignment removes any misalignment of the probes 22A and corrects the contact pressure to an appropriate value. Subsequently, the main chuck 20 moves for the purpose of inspection, and inspection is resumed.

Figure 4:
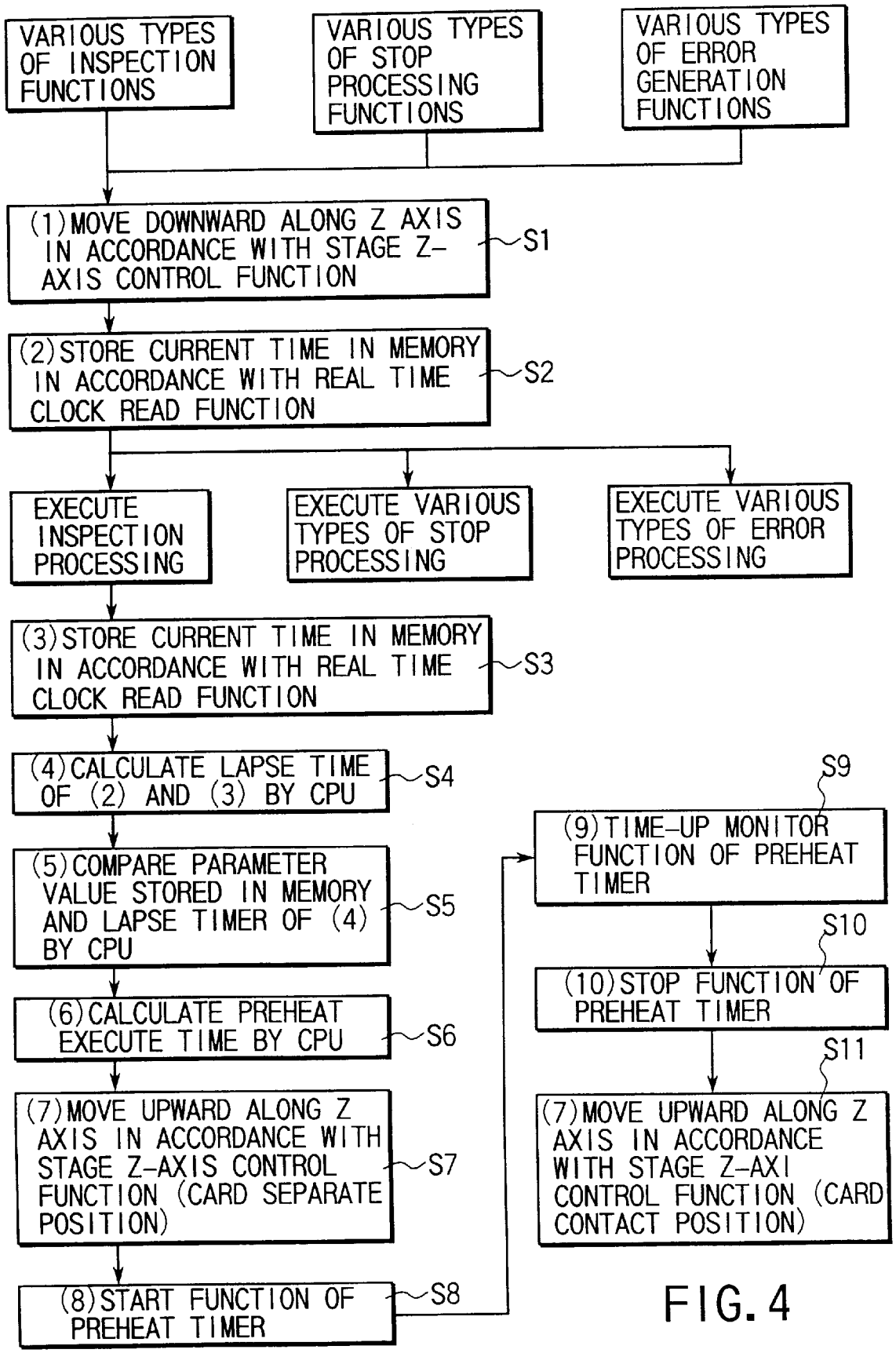
FIG. 4 is a block diagram showing the flow performed when practicing the probe method of the present invention.

The preheat function of the probe apparatus 10 has various types of inspection functions, various types of stop functions, and various types of error generation functions, as in the functional block diagram of FIG. 4. The various types of inspection functions include the above-described preheat function, which is executed in the time of need, as well as a preheat function which is performed after needle mark checking and needle polishing described above. The various types of stop functions include a preheat function which is performed when inspection is to be resumed after the probe apparatus 10 is stopped. The various types of error generation functions include a preheat function which is performed to resume inspection, when an error occurs in the probe apparatus 10, after the error is recovered. Since this embodiment is directed to the preheat function in high-temperature inspection, the various types of inspection functions shown in FIG. 4 are executed.

A probe method according to the present invention which employs the above probe apparatus 10 will be described with reference to FIG. 4.

Referring to FIG. 4, during high-temperature inspection, the main chuck 20 (stage in FIG. 4) moves downward for some reason to a position lower than the inspection position and retreats (S1). The current time point of the real time clock 39 is stored in the real time storage mechanism 40 (memory in FIG. 4) through the CPU 38 (S2). Inspection processing is automatically selected and executed. The current time point of the real time clock 39 is always stored in the real time storage mechanism 40 also through the CPU 38 (S3). The retreat time calculation mechanism 34 (CPU in FIG. 4) calculates the retreat time t (lapse time in FIG. 4) on the basis of the time points read in steps S2 and S3 (S4). The preheat execute determination mechanism 35 compares the retreat time t with the reference time τ stored in the parameter storage mechanism 41 (S5), and determines whether preheating is necessary. If it is determined that preheating is necessary, the preheat time calculation mechanism 36 calculates the preheat execute time on the basis of the relationship shown in FIG. 3, and the calculated time is set in the preheat timer 42 (S6). As the retreat time elapses, the main chuck 20 moves upward to the inspection position (the card separate position in FIG. 4). The preheat end determination mechanism 37 monitors the function of the preheat timer 42 (S8). When the timer time of the preheat timer 42 ends (time-up) (S9), the preheat end determination mechanism 37 determines that preheating is ended (S10). On the basis of this determination,, the main chuck 20 moves upward to a position where it comes into contact with the wafer W, and high-temperature inspection is resumed (S11).

Figure 5:
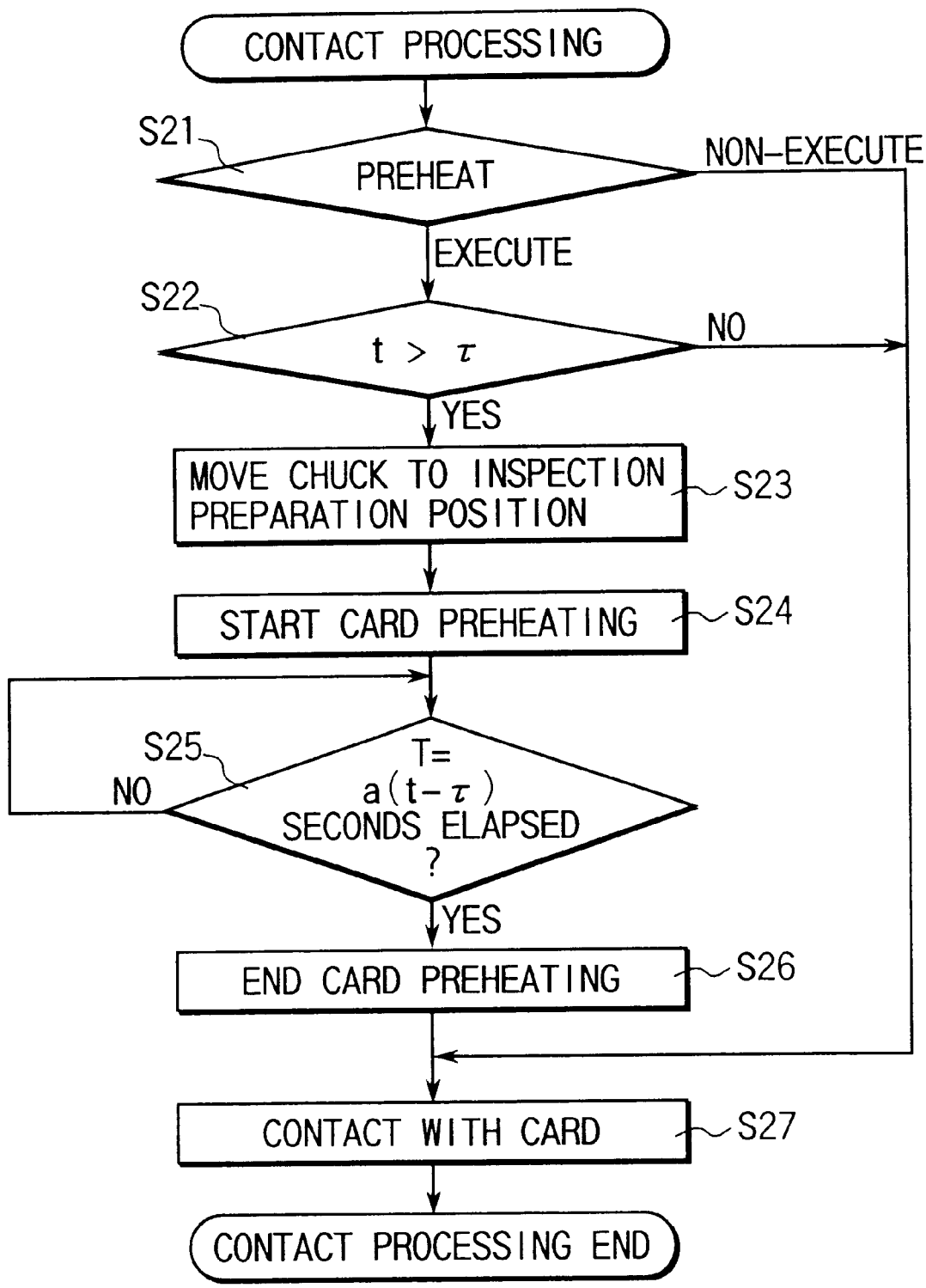
FIG. 5 is a flow chart showing the procedure of the preheat operation in the probe method of the present invention.

FIG. 4 shows the procedure performed when preheating the probe card 22. As described above, sometimes the probe card 22 is not preheated. FIG. 5 shows a procedure required to determine this. In FIG. 5, execution of preheating is set by the preheat execute setting mechanism 31 in advance. When the main chuck 20 retreats to a position lower than the inspection position, the preheat execute mechanism 32 automatically determines that preheating is necessary (step S21). The preheat execute determination mechanism 35 compares the already calculated retreat time t with the preset reference time τ (S22). If the retreat time t is longer than the reference time τ, the main chuck 20 moves to the inspection preparation position (S23), and stops at this position to preheat the probe card 22 and the probes (S24). At this time point, the preheat timer 42 starts counting. The preheat end determination mechanism 37 constantly monitors the operation of the preheat timer 42, and determines whether the preheat time exceeds the preheat execute time (S25). While the preheat time does not exceed the preheat execute time, this determination operation is repeated. If the preheat end determination mechanism 37 determines that the preheat execute time has elapsed, preheating is ended (S26). Thereafter, the flow returns to the original high-temperature inspection program, and the wafer W comes into contact with the probes 22A of the probe card 22 (S27).

If it is determined in step S22 that the retreat time t is shorter than the reference time τ, the preheat execute determination mechanism 35 determines that preheating is unnecessary. The flow jumps from step S22 to S27, and operation of bringing the wafer W and the probe card 22 into contact with each other is started. If it is set in the probe alignment setting mechanism 43 that probe alignment is to be executed, after preheating, probe alignment is performed, and operation of bringing the wafer W and the probe card 22 into contact with each other is started.

If it is set in the preheat execute setting mechanism 31 that preheating is not to be executed, the flow jumps from step S21 to S27, and the operation of bringing the wafer W and the probe card 22 into contact with each other is started.

As described above, according to this embodiment, when the main chuck 20 retreats to a position lower than the inspection position during high-temperature inspection of the wafer W, the position detection sensor 33 automatically detects this retreat. The retreat time calculation mechanism 34 calculates the retreat time t of the main chuck 20, and the preheat execute determination mechanism 35 determines whether the probe card 22 is to be preheated on the basis of the retreat time t. If the preheat execute determination mechanism 35 determines that preheating is necessary, the preheat time calculation mechanism 36 calculates the preheat execute time T on the basis of the retreat time t and the parameter a of the probe card 22, and preheating is executed by the preheat end determination mechanism 37 for the time T. The wafer W and the probes are brought into accurate contact with each other. The reliability of inspection improves as well as the throughput of inspection.

If it is set in the probe alignment setting mechanism 43 that probe alignment is to be performed after preheating, probe alignment is performed after preheating and before start of the operation of bringing the wafer W and the probes into contact with each other. Inspection is performed with higher reliability.

According to the present invention, during inspection at a predetermined temperature, even if the main chuck 20 moves downward to a position lower than the inspection position to stay there and the temperature of the probe card and the probes falls, the probe card and the probes are automatically preheated, so that the inspection reliability improves as well as the throughput. According to the present invention, the reliability of high-temperature inspection can be further improved.

The present invention is not limited to this embodiment. Any technique is included in the probe method and apparatus of the present invention as far as it automatically preheats the probe card and the probes when the main chuck of the object to be inspected moves downward from the inspection position during inspection for an unexpected reason.

Another embodiment of the present invention will be described with reference to FIGS. 6 to 13.

When an object is to be inspected at a high or low temperature by the probe apparatus shown in FIG. 14 and inspection starts without preheating the probe card and the probes to the inspection temperature, the positions of the pin points of the probes may be displaced before the probe card and the probes reach the inspection temperature, and the probes and the wafer W cannot sometimes be brought into accurate contact with each other.

Figure 6:
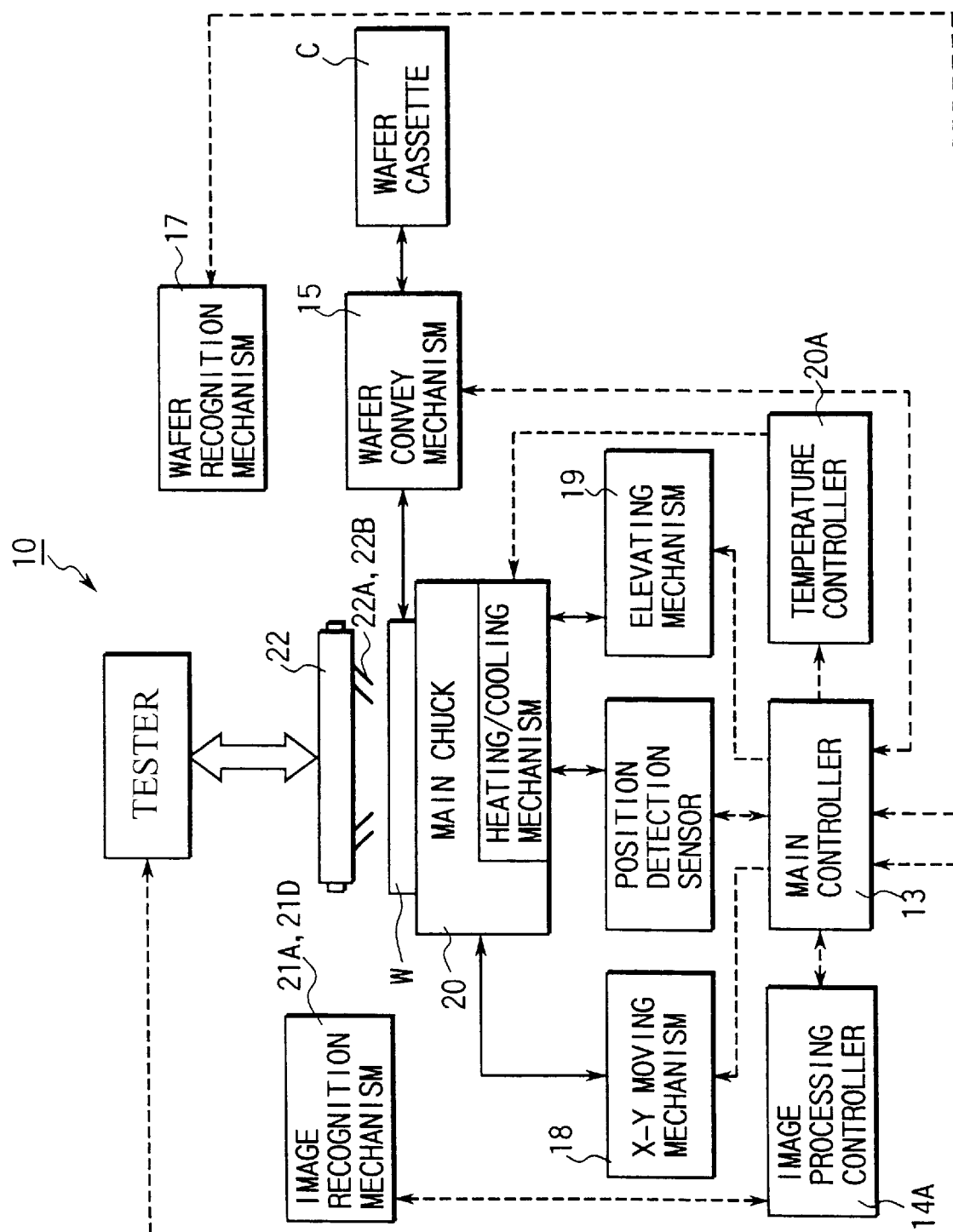
FIG. 6 is a block diagram showing the arrangement of a probe apparatus according to the present invention.

FIG. 6 explains another embodiment of the present invention in high-temperature inspection. A probe apparatus 10 of this embodiment has a function of correcting the position of probes 22A when a probe card 22 and the probes 22A thermally expand, and reliably brings the probes 22A and a wafer W into accurate contact with each other. This correction function is executed in accordance with a card contact correction program (to be referred to as the "correction program" hereinafter).

Figure 7:
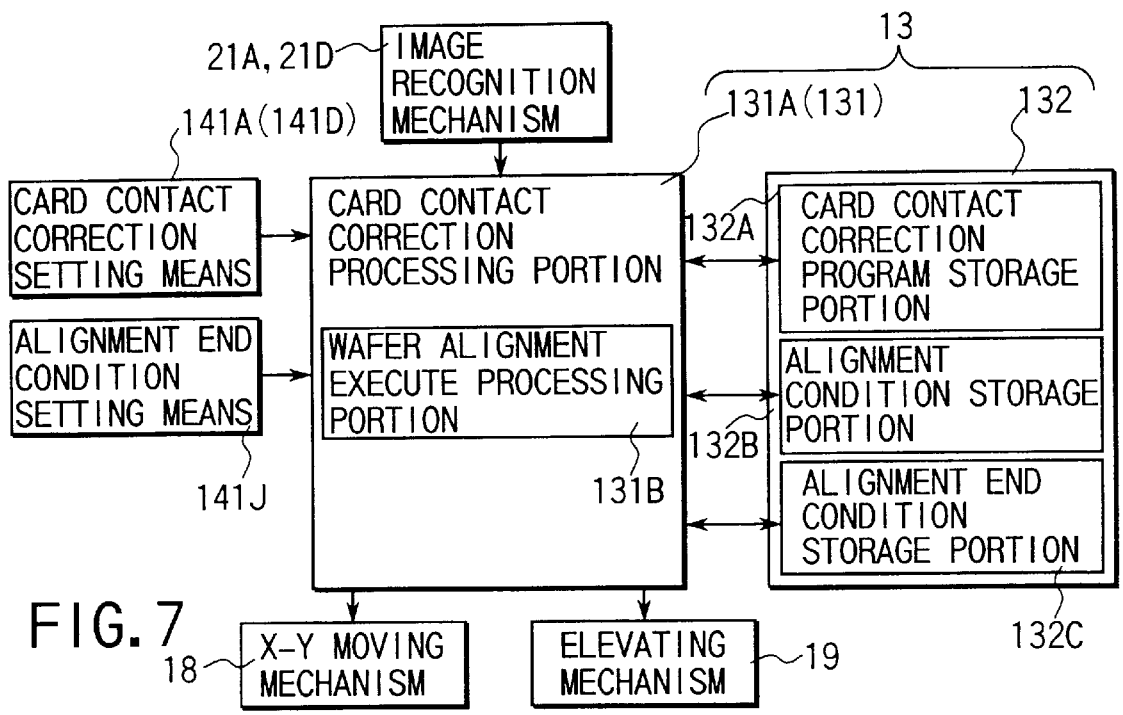
FIG. 7 is a functional block diagram showing the main part of the probe apparatus shown in FIG. 6.

Card contact correction will be described. FIG. 7 shows the main part of a controller 13 shown in FIG. 6 according to this embodiment. The controller 13 has a central processing unit (CPU) 131 and a storage unit 132. The card contact correction program (to be referred to as the correction program hereinafter) is stored in a card contact correction program storage portion (to be referred to as the correction program storage portion hereinafter) 132A of the storage unit 132. This correction program is started through the CPU 131 and displayed on an operation screen 141, shown in FIG. 8, through an image processing controller 14A. As will be described later, various types of setting operations concerning card contact correction are performed on the operation screen 141. When this correction program is started, the CPU 131 shown in FIG. 7 functions as a card contact correction processing portion 131A. A wafer alignment execute processing portion (to be referred to as the wafer alignment processing portion hereinafter) 131B operates under the control of the card contact correction processing portion 131A, and corrects the contact position so that the probes 22A of the probe card 22, that thermally expand during high-temperature inspection, and the electrodes of the respective chips reliably come into contact with each other.

An example of card contact correction will be described. One probe 22B is registered as a reference probe in advance. Before start of inspection of the first chip, the probes 22A are aligned by using this reference probe (probe alignment). Before inspection of each of the second and following chips, probe alignment is performed by using the reference probe 22B. The former alignment is performed only once before inspection of the first chip, and the latter alignment is performed every time inspection of each of the second and following chips is to be performed, and is continued until the probe card 22 and the probes thermally stabilize. Whether the latter alignment is to be performed is determined by the card contact correction processing portion 131A. This determination is made with reference to alignment end conditions to be described later. In the latter alignment, after probe alignment is performed, the wafer alignment processing portion 131B aligns the wafer W as well depending on the situation.

Figure 8:
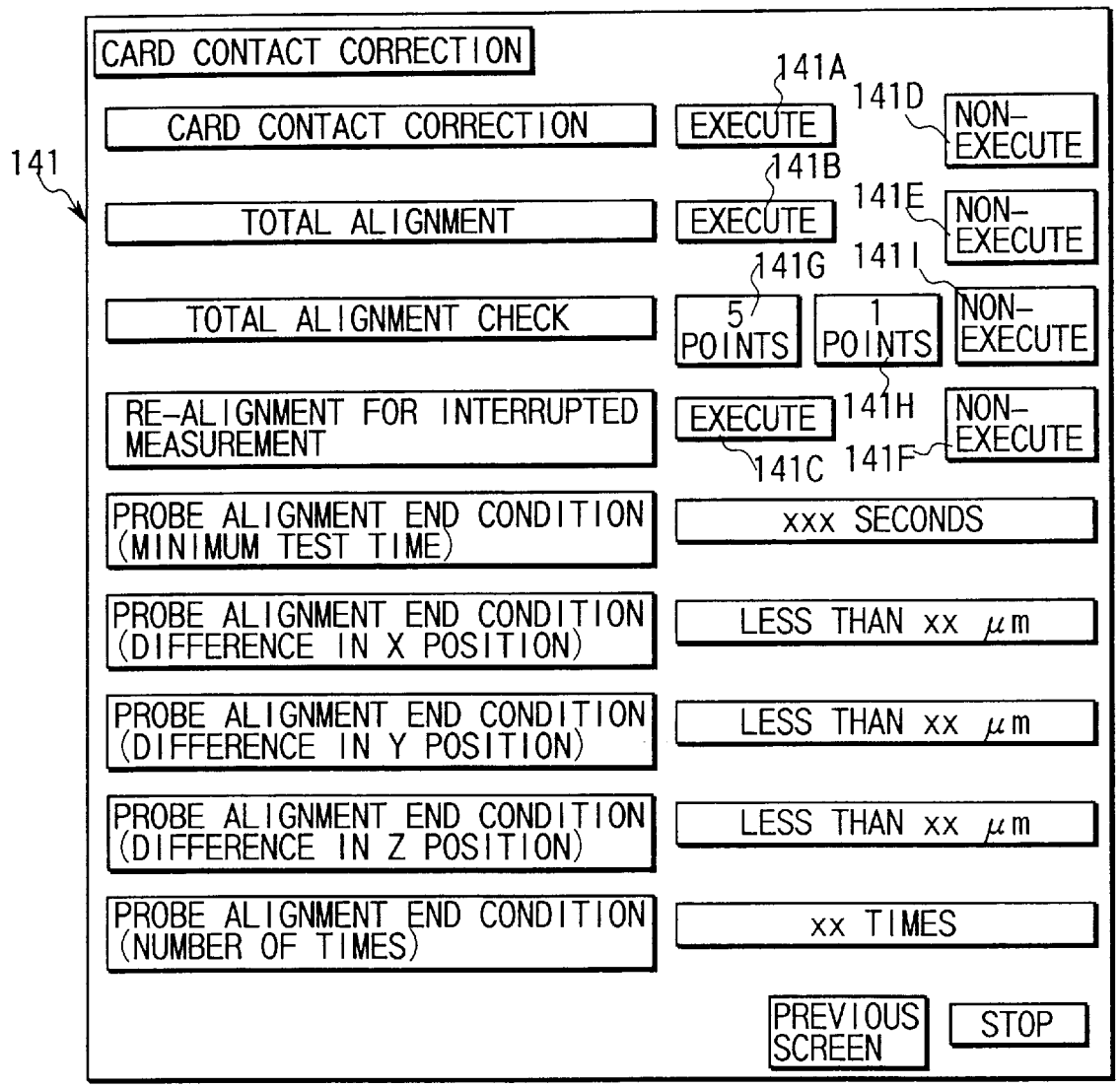
FIG. 8 shows an operation screen displayed on the display of the probe apparatus shown in FIG. 6 when practicing the probe method of the present invention.

The content of card contact correction processing is displayed on the operation screen 141 separately regarding its processing items, as shown in FIG. 8. Examples of the processing items are "card contact correction", "total alignment", "total alignment check", and "realignment for interrupted measurement". Total alignment refers to alignment processing of the wafer W which is executed after probe alignment. "Execute" keys 141A, 141B, and 141C, and "non-execute" keys 141D, 141E, and 141F are displayed beside "card contact correction", "total alignment", and "realignment for interrupted measurement", respectively. Whether the respective processing items are to be executed is set by touching these keys serving as the card contact correction setting means. A "5-point" key 141G, a "1-point" key 141H, and a "non-execute" key 141I are displayed beside the processing item "total alignment check". Of these keys serving as the card contact correction setting means, if the "5-point" key 141G is operated, while the main chuck 20 moves in the X and Y directions in total alignment, five registered points on the wafer W are recognized by an image recognition mechanism 21A (an upper CCD camera), and alignment check is performed. If the "1-Point" key 141H is operated, one registered point on the wafer W is image-recognized by the image recognition mechanism 21A, and alignment check is performed. In FIG. 7, the "execute" key 141A and "non-execute" key 141D for card contact correction of the card contact correction setting means represent other keys as well. As shown in FIG. 7, these setting conditions are stored in an alignment condition storage portion 132B of the storage unit 132.

Alignment end conditions are set by using the operation screen 141. The alignment end conditions are the determination criterion in determining whether the positions of the pin points of the probes 22A have stabilized. The card contact correction processing portion 131A determines whether the alignment end conditions are satisfied. In this embodiment, as the alignment end conditions, the allowable value of the amount of displacement from the positions of the pin points of the probes 22A before the last inspection to the current positions of the pin points, the minimum inspection time required for chip inspection, and the number of times of alignment operations both the allowable value of the amount of displacement and the minimum inspection time should be satisfied continuously and simultaneously, are set by an alignment end condition setting means 141J. As shown in FIG. 7, these preset values are stored in an alignment end condition storage portion 132C of the storage unit 132.

(1) Allowable Value of Amount of Displacement and Minimum Inspection Time

A person who wants to practice the present invention can set the allowable value of the amount of displacement in each of the X, Y, and Z directions in accordance with the types of wafers considering the size of the electrodes of inspection items, the size and structure of probes, and the like. For example, the allowable values in the X, Y, and Z directions can be set to 3 $\mu$m, 3 $\mu$m, and 5 $\mu$m, respectively.

The amount of displacement of the pin points of the probes 22A arising from thermal expansion or shrinkage gradually increases, every time inspection of the respective chips is repeated, until the probe card 22 and the probes 22A reach the inspection temperature. As the probe card 22 and the probes 22A approach the inspection time, the amount of displacement gradually decreases until it finally reaches zero. Accordingly, the amount of displacement of the pin points of the probes 22A is largely influenced by the length of the inspection time of each chip. Even when the amount of displacement from the positions of the pin points before the last inspection to the current positions of the pin points falls within the allowable range, if the inspection time is short, it cannot be determined that the probe card 22 and the probes 22A have thermally stabilize. When the last chip inspection time is shorter than a predetermined minimum inspection time, even if the amount of displacement falls within the allowable range, it is preferable that alignment of the probes 22A be performed before the next inspection. The number of times of alignment operations is added to the number of times of alignment operations performed so far, as will be described later. The minimum inspection time can be set to, e.g., 120 seconds.

(2) Number of Times of Alignment Operations

The number of times of alignment operations is the number of times the alignment end conditions concerning the allowable value of the amount of displacement and the minimum inspection time should be satisfied continuously and simultaneously. This number of times is set to such a value that the pin points of the probes 22A will not cause displacement during next inspection. This number of times can be set to, e.g., 3.

During chip inspection, if the alignment end conditions of item (1) are satisfied, the probe card 22 and the probes 22A have nearly thermally stabilized. This signifies that, in the next inspection, the probes 22A will come into contact with the corresponding electrode pads and predetermined inspection will be executed reliably. The number of times of alignment operations is incremented each time alignment is performed. Once the number of times of alignment operations reaches a preset value, the respective chips can be inspected accurately without alignment. When any of the alignment end conditions of item (1) is not satisfied, even if the conditions of item (1) are satisfied before that, the probe card 22 is thermally unstable. In this case, the number of times of alignment operations is cleared and set to zero in each alignment.

A "previous screen" key and a "stop" key are displayed on the operation screen 141. When the "previous screen" key is operated, the operation screen 141 returns to the previous screen; when the "stop" key is operated, execution of the correction program is stopped.

A probe method according to an embodiment of the present invention will be described with reference to FIGS. 6 to 11. Assume that the probe method according to the present invention is to be practiced. When a "card contact correction" key (not shown) on the operation screen 141 shown in FIG. 8 is touched, the corresponding processing item is displayed on the operation screen 141, as shown in FIG. 8. Various types of conditions necessary for contact correction are set on the operation screen 141. For example, if the "execute" key 141A for "card contact correction", the "execute" key 141B for "total alignment", the "5-point" key 141G for "total alignment check", and the "execute" key 141C for "realignment for interrupted measurement" are touched on the operation screen 141, the CPU 131 determines that the card contact correction processing portion 131A is to automatically execute the respective items. When the respective values of the four alignment end conditions are input through the key board or the like and are displayed on the operation screen 141, every time one of the second and following chips is to be inspected with reference to these alignment end conditions, the card contact correction processing portion 131A determines whether succeeding probe alignment is to be performed before each inspection.

Figure 9:
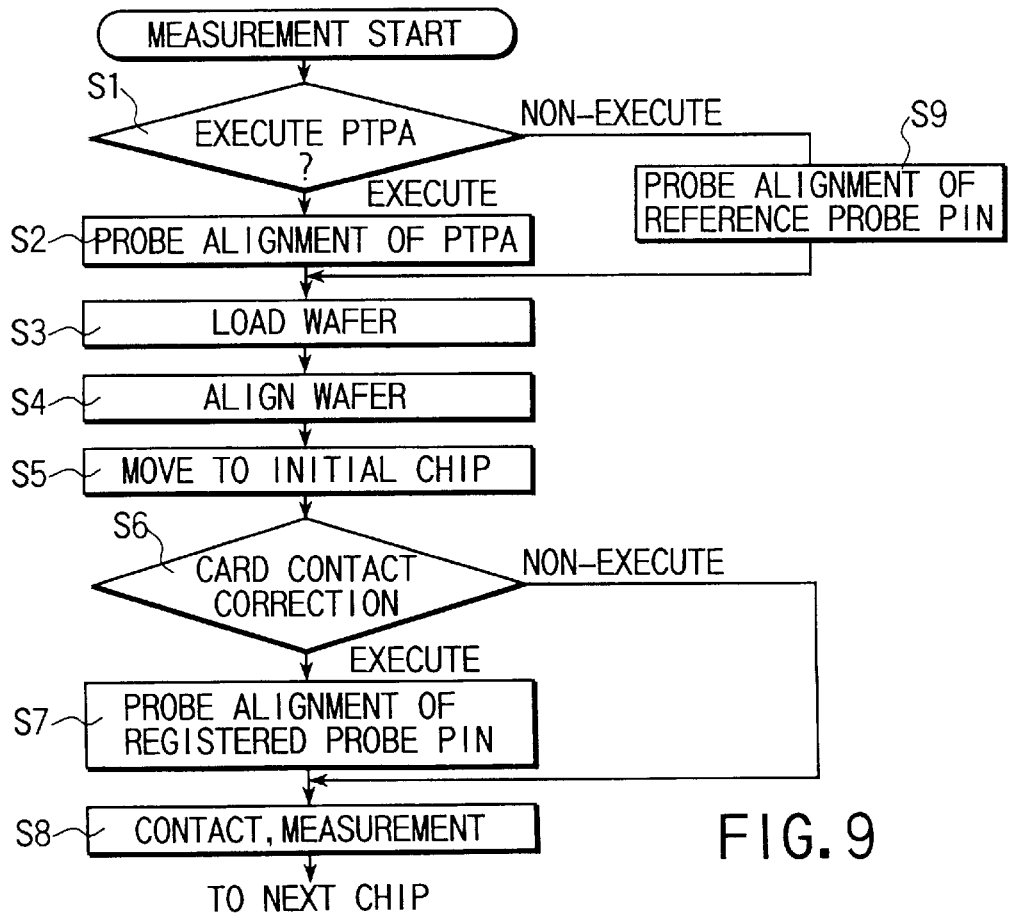
FIG. 9 is a flow chart up to inspection of the first chip in practicing the probe method of the present invention.

After the various types of conditions are set as described above, measurement with the probe apparatus starts. The main chuck 20 has already reached the inspection temperature (e.g., 180° C.). As shown in FIG. 9, the CPU 131 determines whether PTPA (Probe to pad Alignment) is to be executed (S1). When the CPU 131 determines that PTPA is to be executed, the images of the plurality of registered probes 22A (the probes, other than the reference probe 22B, serving as the alignment target) are recognized with the lower CCD camera 21D in accordance with the same procedure as in the conventional case, and probe alignment is performed on the basis of the recognized images (S2). After a wafer convey mechanism 15 in the loader chamber places the wafer W on the main chuck 20 (S3), an alignment mechanism 21 (the upper CCD camera 21A) and the main chuck 20 align the wafer W (S4). The main chuck 20 is driven to move the chip on the wafer W which is to be inspected first to immediately beneath the probe card 22 (S5). The operation so far is performed in accordance with the conventional inspection program.

During this process as well, the probe card 22 gradually thermally expands (shrinks) as it is thermally influenced by the main chuck 20. The positions of the pin points of the probes 22A deviate, making it difficult for the pin points to appropriately come into contact with the wafer W. In this embodiment, since it is set in advance by using the operation screen 141 that "card contact correction" is to be executed, the card contact correction processing portion 131A determines that probe alignment is to be executed (S6). Probe alignment is performed by using the lower CCD camera 21D with reference to, e.g., one reference probe 22B. The positions of the pin points of the currently registered probes 22A are image-recognized by the lower CCD camera 21D (S7). The main chuck 20 moves upward in the Z direction to cause the probes 22A and the electrode pads of the first chip to come into contact with each other. The main chuck 20 is over-driven, and the first chip is inspected (S8).

If it is determined in step S1 that PTPA is not to be executed, alignment is performed by using one reference probe 22B which is registered in the alignment condition storage portion 132B in advance differently from the registered probes 22A (S9), and step S3 is executed. If it is set by using the operation screen 141 that "card contact correction" is not to be executed, the flow directly advances from step S6 to step S8, and the first chip is inspected without probe alignment.

Figure 10:
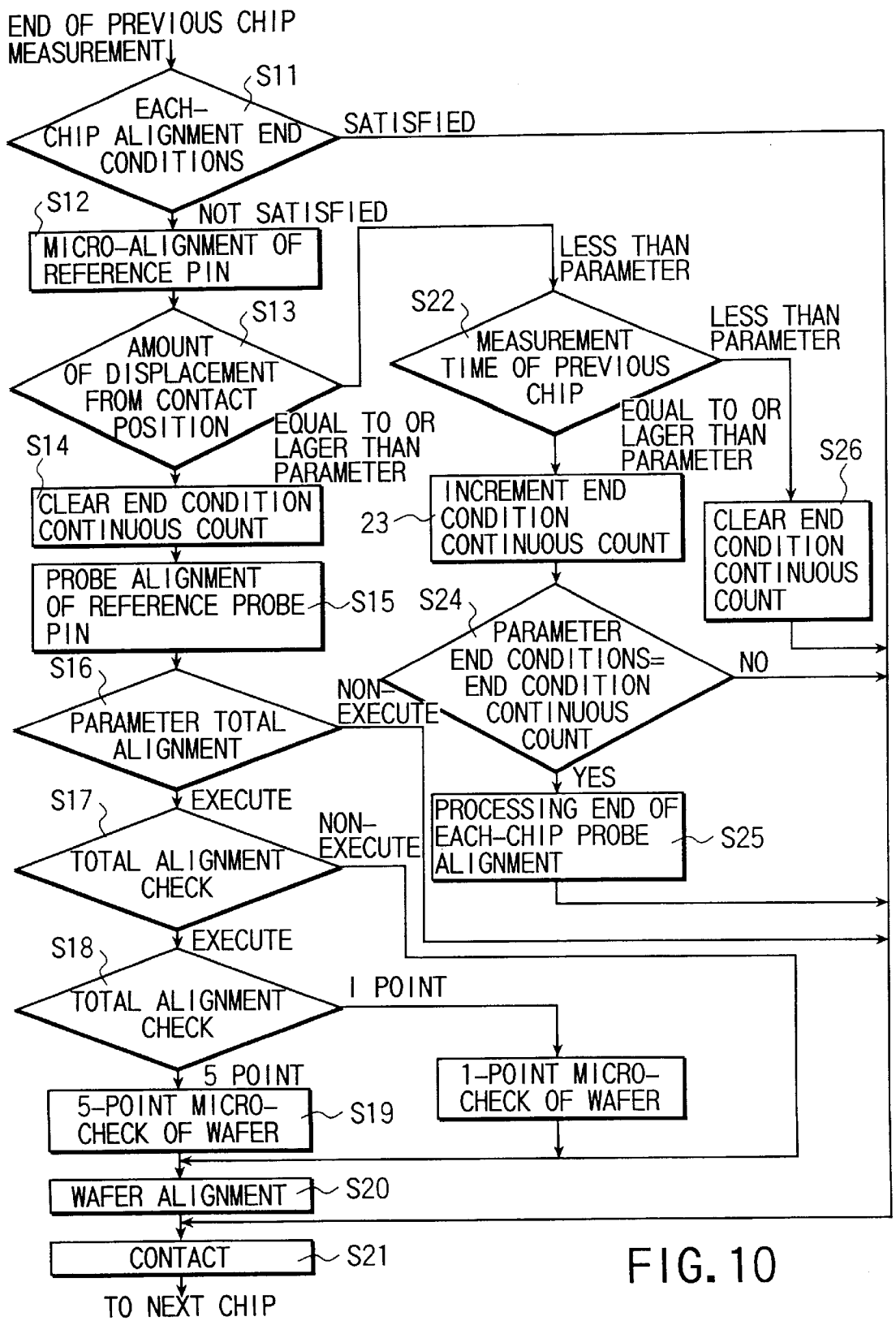
FIG. 10 is a flow chart up to inspection of the second and following chips in practicing the probe method of the present invention.

After the first chip is inspected, the flow advances to step S11 shown in FIG. 10. In step S11, before the second chip is inspected, the card contact correction processing portion 131A determines whether preset each-chip alignment end conditions (the three alignment end conditions described above) are satisfied. If it is determined that these conditions are not satisfied, the main chuck 20 is moved by an X-Y moving mechanism 18 and an elevating mechanism 19 on the basis of an instruction signal from the card contact correction processing portion 131A, and the reference probe 22B is aligned (S12). Subsequently, the card contact correction processing portion 131A determines whether the amount of displacement of the reference probe 22B before inspection of the first chip falls within an allowable range (S13). If the amount of displacement exceeds the allowable value in at least one of the X, Y, and Z directions, the count of the alignment end conditions is cleared to zero (S14). Probe alignment is performed by using one reference probe 22B. The current positions of the pin points are image-recognized, and the contact positions are corrected to the recognized positions (S15).

Furthermore, in this embodiment it is set such that total alignment and total alignment check are respectively executed. Therefore, the wafer alignment processing portion 131B determines that the parameter total alignment (alignment in units of chips; with this parameter, it is set whether wafer alignment is to be performed after the registered probe pin is aligned in each of the second and following contact operations) is to be executed (S16), and determines that total alignment check is to be executed (S17).

Since it is set that total alignment is to be performed at 5 points, the wafer alignment execute processing portion 131B automatically determines this (S18). On the basis of a signal from the wafer alignment execute processing portion 131B, an alignment bridge 21B moves to the probe center. The main chuck 20 moves such that the 5 points described above sequentially come to immediately underneath the upper CCD camera 21A. The current positions of the 5 points on the wafer W are checked by image recognition (S19). Wafer alignment is performed, and the position of the wafer W in X, Y, and Z directions is corrected (S20). The main chuck 20 is moved by the X-Y moving mechanism 18 and elevating mechanism 19. The probes 22A and the electrode pads of the second chip reliably come into accurate contact with each other, and this chip is inspected reliably (S21).

If the card contact correction processing portion 131A determines in step S13 that the amount of displacement from the position of the pin point of the reference probe 22B before inspection of the first chip to the current position of the pin point falls within the allowable range, the flow advances to step S22. In step S22, the card contact correction processing portion 131A compares the actual inspection time of the first chip with the minimum inspection time. If it is determined that the actual inspection time exceeds the minimum inspection time, the continuous count of the alignment end conditions is incremented by one (S23). This count is compared with the preset number of times of alignment operations (S24). If the count has not reached the preset number of times of alignment operations, the flow advances to step S21. Next alignment is executed, and the second chip is inspected. If it is determined in step S24 that the count has reached the preset number of times of alignment operations, the flow advances to step S25 of each-chip probe alignment processing end, and then to step S21. Each-chip probe alignment processing is not performed, and inspection of the next and following chips is performed. Usually, however, the flow does not advance to step S25 at this stage.

If it is determined in step S22 that the inspection time of the first chip has not reached the minimum inspection time, the count of the alignment end conditions is cleared to zero (S26). The flow advances to step S21, and the second chip is inspected. Accordingly, before inspection of the next chip, the number of times of alignment operations is counted from the beginning.

When inspection of the second chip is ended, the flow returns to step S11, and the respective steps described above starting with step S11 are repeated. When inspection is repeated and the cumulative inspection time becomes long, the probe card 22 and the probes gradually approach the inspection temperature of the water W, and the amount of displacement of the reference probe 22B gradually decreases. Accordingly, the flow advances from step S13 to step S22, and only the inspection time is determined. Finally, the number of times of alignment operations is continuously counted, so that the flow advances to step S25. After that, alignment is not performed, and objective inspection is performed accurately and reliably.

Figure 11:
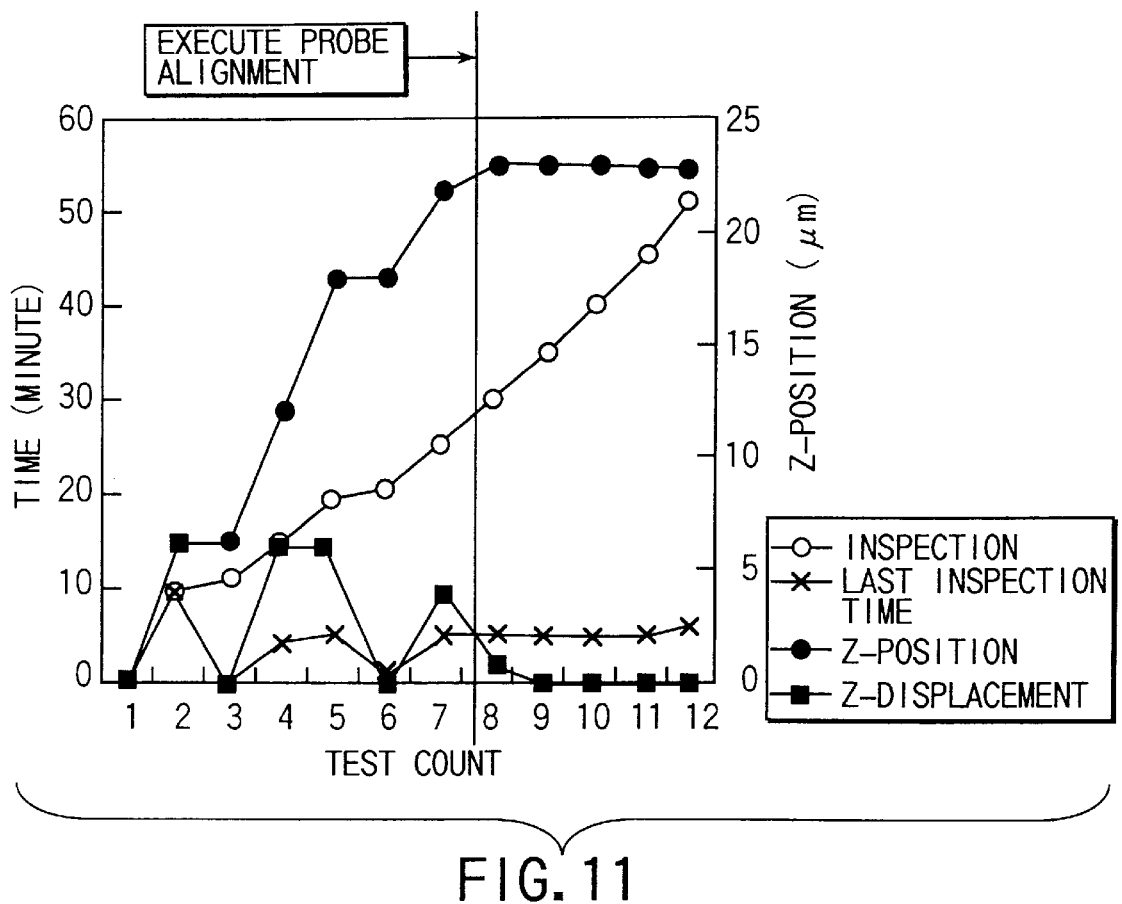
FIG. 11 is a graph showing the relationship among the number of times of chip inspecting operations, the position of the pin point of the probe in the Z direction, the amount of displacement of the pin point of the probe in the Z direction, and the inspection time of each chip inspecting operation when the probe method of the present invention is practiced.
Figure 13:
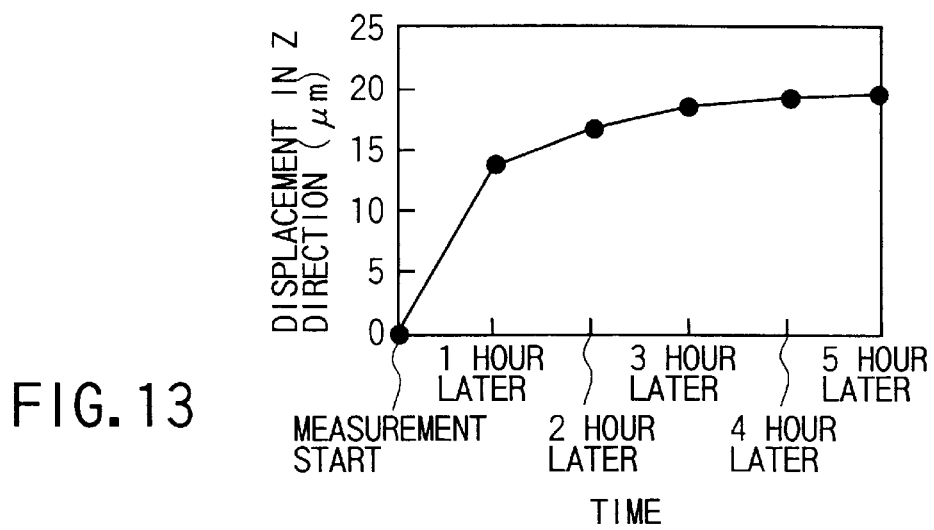
FIG. 13 is a graph showing the relationship between the inspection lapse time and the amount of displacement of the pin point of the probe in the Z direction when high-temperature wafer inspection is performed.
Figure 12A:
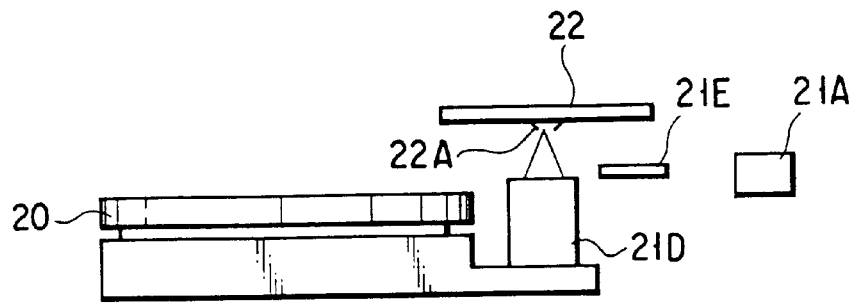
FIGS. 12A to 12C are views respectively showing examples of an alignment method using the probe apparatus.
Figure 12B:
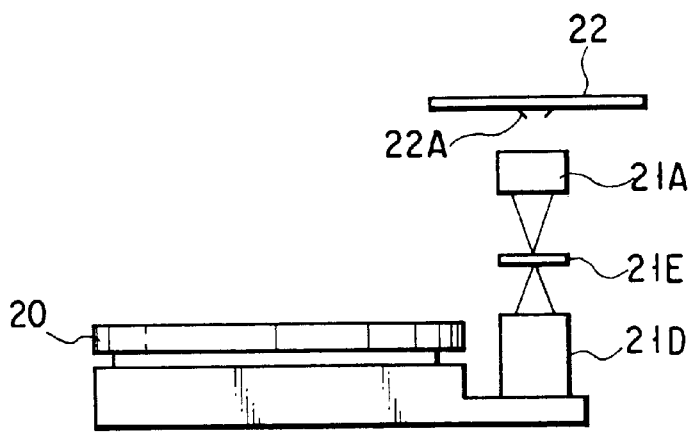
Figure 12C:
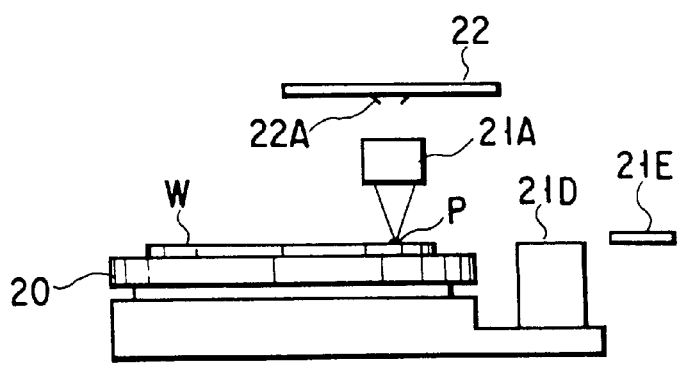

FIG. 11 shows the Z-position of the pin point of the reference probe 22B, the amount of displacement of the Z-position, the inspection time, and the number of times of inspection that are counted until the position of the pin point of the reference probe 22B thermally stabilize since the start of inspection. In this case, of the probe alignment end conditions, the allowable value of the pin point of the reference probe 22B in the Z direction is set to 5 $\mu$m, the minimum inspection time is set to 120 seconds, and the number of times of alignment operations is set to twice. According to FIG. 11, in each case of inspection of the third and sixth chips, the amount of displacement in the Z direction from the position of the pin point before the last inspection to the current position of the pin point is less than 5 $\mu$m. Since the inspection time is less than 120 seconds, the flow advances from step S22 to step S26 of FIG. 10, and the number of times of alignment operations is cleared to zero. Accordingly, alignment must be executed in inspection of the next and following chips. In the case of inspection of the eighth chip, the amount of displacement from the position of the pin point before the last inspection to the current position of the pin point is less than 5 $\mu$m, and the inspection time is equal to or longer than 120 seconds. Hence, the flow advances from step S22 to step S23 of FIG. 10. Since the number of times of alignment operations is incremented twice continuously, the flow advances to step S25 through step S24. In inspection of the next and following chip, chip inspection is performed without alignment.

If high-temperature inspection is interrupted for some reason and is to be resumed, since the "execute" key 141C of the processing item "realignment for interrupted measurement" on the operation screen 141 has been operated, inspection is resumed in accordance with the flow charts of FIGS. 9 and 10.

As described above, according to the present invention, in order to bring the probes 22A, that have been displaced due to thermal expansion of the probe card and probes, and the electrodes of the respective chips into contact with each other, the contact positions between the probes 22A and electrodes of the respective chips are corrected.

Before inspection of the first chip, it is determined whether alignment using the reference probe 22B is to be executed in order to correct the contact position of the reference probe 22B which thermally expands (shrinks). If it is determined that this alignment is to be executed, this alignment is executed. Before inspection of each of the second and following chips, it is determined on the basis of the alignment end conditions whether alignment of the reference probe 22B is to be ended. If it is determined that this alignment is not to be ended, alignment is executed. Even if the probe card 22 and the probes thermally expand (shrink) during inspection, the wafer W and the reference probe 22B are always free from misalignment. The probes constantly come into contact with the electrodes of the wafer W accurately with a stable contact pressure, so that highly reliable high-temperature inspection can be performed.

The present invention is not limited to the above embodiment.

For example, in place of the embodiment shown in FIGS. 6 to 13, the alignment end conditions and the like can be set as required in accordance with the type of probe card. In fine, the present invention can be applied to any case as far as the probe card and probes are heated or cooled during a predetermined-temperature inspection and the positions of the pin points of the probes accordingly deviate.

The various types of control operations and tasks of the present invention can be performed with electronic circuits or with computer programs.

In the present invention, the steps and mechanisms for detecting that the temperature of the probe card and probes has dropped below the predetermined high temperature can be steps and mechanisms that use a temperature sensor.

In the present invention, the steps and mechanisms for detecting the time during which the main chuck retreats can be steps and mechanisms that use a sensor for detecting the position of the main chuck, or steps and mechanisms that operate on the basis of a control signal for retreating the main chuck.

In the present invention, the steps and mechanisms for detecting that the temperature of the probe card and probes has dropped below a predetermined temperature can be steps and mechanisms that use a temperature sensor.

In the present invention, the steps and mechanisms for correcting misalignment of the probes can measure the temperature of the probe card and probes and can end correction when the temperature has reached a predetermined inspection temperature.

Further features and modifications are easily achieved by the person skilled in the art. Therefore, the present invention has a wider scope and is not limited to specific detailed embodiments and typical embodiments disclosed herein. Various changes and modifications may be made within the wide concept of the invention defined by the appended claims and the interpretation and scope of its equivalent without departing from it.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A probe method comprising the steps of:
   placing an object to be inspected having a plurality of inspection items on a main chuck which is movable in X, Y, Z, and θ directions and controlled to a predetermined high temperature;
   aligning the object to be inspected and probes provided to said probe card with each other;
   indexing said main chuck to set at least one inspection item of the inspection items of the object to be inspected at an inspection preparation position;
   contacting electrodes of at least one of the inspection items and said probes electrically with each other by moving said main chuck toward said probe card; and
   measuring electrical characteristics of the inspection item with a tester connected to said probes,
   the indexing step, the contacting step, and the measuring step being repeatedly performed to inspect successively the electrical characteristics of predetermined inspection items of the inspection items, wherein
      the contacting step comprises the steps of
         detecting that a temperature of said probe card and said probes has fallen below the predetermined high temperature as said main chuck retreats from said predetermined inspection preparation position in a direction to separate from said probe card, and
         correcting misalignment of said probes resulting from the temperature fall when it is detected that the temperature of said probe card and said probe has fallen below the predetermined high temperature.

2. A method according to claim 1, wherein
   the step of detecting that the temperature of said probe card and said probes has fallen below the predetermined high temperature comprises the step of
      detecting a retreat time during which said main chuck continues to retreat from said predetermined inspection preparation position in the direction to separate from said probe card, and determining that the temperature of said probe card and said probes has fallen below the predetermined high temperature on the basis of the retreat time.

3. A method according to claim 1, wherein
   the step of detecting that the temperature of said probe card and said probes has fallen below the predetermined high temperature comprises the step of
      detecting a retreat time during which said main chuck continues to retreat from said predetermined inspection preparation position in the direction to separate from said probe card, and
      determining that the temperature of said probe card and said probes has fallen below the predetermined high temperature on the basis of the retreat time, and
   the step of correcting misalignment of said probes comprises the steps of
      setting a preheat execute time, during which said probe card and said probes are to be heated, on the basis of the retreat time, and
      heating said probe card and said probes during the preheat execute time.

4. A method according to claim 3, wherein the step of correcting misalignment of said probes comprises the steps of
   setting the preheat execute time, during which said probe card and said probes are to be heated, on the basis of the retreat time,
   heating said probe card and said probes during the preheat execute time, and
   aligning the inspection items of the object to be inspected placed on said main chuck and said probes with each other by controlling a position of said main chuck after the heating step.

5. A method according to claim 3, wherein the step of setting the preheat execute time, during which said probe card and said probes are to be heated, on the basis of the retreat time, comprises the step of setting the preheat execute time on the basis of the retreat time within a range not exceeding a time required for heating said probe card from room temperature to the predetermined high temperature.

6. A probe method comprising the steps of:
   placing an object to be inspected, having a plurality of inspection items, on a main chuck which is movable in X, Y, Z, and θ directions and controlled to a predetermined temperature;
   aligning the object to be inspected and probes provided to said probe card with each other;
   indexing said main chuck to set at least one inspection item of the inspection items of the object to be inspected at an inspection preparation position;
   contacting electrodes of at least one of the inspection items and said probes electrically with each other by moving said main chuck toward said probe card; and
   measuring electrical characteristics of the inspection item with a tester connected to said probes,
   the indexing step, the contacting step, and the measuring step being repeatedly performed to inspect successively the electrical characteristics of predetermined inspection items of the inspection items, wherein
      a step of correcting misalignment of said probe card and said probes is performed prior to each contacting step which is performed repeatedly in a process during which said probe card and said probes are controlled to reach the predetermined temperature.

7. A method according to claim 6, wherein the correcting step of correcting misalignment of said probe card and said probes comprises the steps of correcting misalignment of said probe card and said probes prior to each contacting step which is performed repeatedly in the process during which said probe card and said probes are controlled to reach the predetermined temperature, and
   each contacting step comprises the step of correcting misalignment of said probe card and said probes in the Z direction during the process by correcting a distance said main chuck is to move toward said probe card.

8. A method according to claim 6, wherein the step of correcting misalignment of said probes comprises the steps of
   determining whether misalignment of said probe card and said probes is to be corrected prior to inspection of the first inspection item, correcting misalignment in accordance with a determination made in the determining step, determining whether misalignment of said probe card and said probes is to be corrected, prior to inspection of each of a second and following inspection items, on the basis of misalignment correction end conditions, and correcting misalignment of said probe card and said probes in accordance with a determination made in the second determining step.

9. A method according to claim 8, wherein the steps of determining whether misalignment of said probe card and said probes is to be corrected prior to inspection of the first inspection item, and determining whether misalignment of said probe card and said probes is to be corrected, prior to inspection of each of a second and following inspection items, on the basis of misalignment correction end conditions, comprise making determination in accordance with whether the temperature has reached the predetermined temperature by detecting the temperature of said probe card and said probes.

10. A method according to claim 8, wherein the misalignment correction end conditions are set on the basis of determination as to whether an amount of displacement from positions of tips of said probes in the last inspection to current positions of said tips falls within an allowable range.

11. A method according to claim 8, wherein the misalignment correction end conditions are set on the basis of determination as to whether a time required for inspection until the last time exceeds a minimum inspection time required for said probe card and said probes to reach the predetermined temperature.

12. A method according to claim 8, wherein the misalignment correction end conditions are set on the basis of determination as to whether an amount of displacement from positions of tips of said probes in the last inspection to current positions of said tips falls within an allowable range, determination as to whether a time required for inspection until the last time exceeds a minimum inspection time required for said probe card and said probes to reach the predetermined temperature, and the number of times it is determined in the above two determinations simultaneously and continuously that the amount of displacement of the positions of said tips of said probes falls within the allowable range and that the time required for inspection until the last time exceeds the minimum inspection time.

13. A probe apparatus comprising:

a prober chamber for inspecting electrical characteristics of an object to be inspected;

a probe card arranged on an upper surface of said prober chamber and having probes;

a main chuck arranged under said probe card in said prober chamber, movable in X, Y, Z, and θ directions, and set to a predetermined high temperature, to place the object to be inspected thereon;

an alignment mechanism for aligning the object to be inspected placed on said main chuck and said probes with each other;

an indexing mechanism for indexing said main chuck to set at least one inspection item of inspection items of the object to the inspected at an inspection preparation position;

a main chuck moving mechanism for moving said main chuck toward said probe card, thereby bringing electrodes of the object to be inspected placed on said main chuck and said probes into electrical contact with each other; and a tester connected to said probes to measure the electrical characteristics of the inspection item, indexing of the inspection item, electrical contact between the electrodes of the object to be inspected and said probes, and measurement of the electrical characteristics of the inspection item being repeatedly performed, wherein said main chuck moving mechanism comprises a temperature fall detection mechanism for detecting that a temperature of said probe card and said probes has fallen below the predetermined high temperature as said main chuck retreats from a predetermined inspection preparation position in a direction to separate from said probe card, and a misalignment correction mechanism for correcting, when it is detected that the temperature of said probe card and said probes has fallen below the predetermined high temperature, misalignment of said probes resulting from the temperature fall.

14. An apparatus according to claim 13, wherein said temperature fall detection mechanism comprises a retreat time detection mechanism for detecting a time during which said main chuck continues to retreat from the predetermined inspection preparation position in the direction to separate from said probe card, and a temperature fall determination mechanism for determining that the temperature of said probe card and said probes has fallen below the predetermined temperature on the basis of the retreat time.

15. An apparatus according to claim 13, wherein said temperature fall detection mechanism comprises a retreat time detection mechanism for detecting a time during which said main chuck continues to retreat from the predetermined inspection preparation position in the direction to separate from said probe card, and a temperature fall determination mechanism for determining that the temperature of said probe card and said probes has fallen below the predetermined temperature on the basis of the retreat time, and said misalignment correction mechanism comprises a preheat execute time setting mechanism for setting a preheat execute time during which said probe card and said probes are to be heated on the basis of the retreat time, and a preheat execute mechanism for heating said probe card and said probes during the preheat execute time.

16. A method according to claim 15, wherein said misalignment correction mechanism comprises a preheat execute time setting mechanism for setting a preheat execute time during which said probe card and said probes are to be heated on the basis of the retreat time, a preheat execute mechanism for heating said probe card and said probes during the preheat execute time, and an alignment mechanism for controlling said main chuck after said probe card and said probes are heated to the predetermined high temperature by said preheat execute mechanism, thereby aligning inspection items of the object to be inspected placed on said main chuck and said probes with each other.

17. An apparatus according to claim 15, wherein said preheat execute time setting mechanism sets the preheat execute time on the basis of the retreat time within a range not exceeding a time required for heating said probe card from room temperature to the predetermined high temperature.

18. A probe apparatus comprising:
- a prober chamber for inspecting electrical characteristics of an object to be inspected;
- a probe card arranged on an upper surface of said prober chamber and having probes;
- a main chuck arranged under said probe card in said prober chamber, movable in X, Y, Z, and θ directions, and set to a predetermined high temperature, to place the object to be inspected thereon;
- an alignment mechanism for aligning the object to be inspected placed on said main chuck and said probes with each other;
- an indexing mechanism for indexing said main chuck to set at least one inspection item of inspection items of the object to the inspected at an inspection preparation position;
- a main chuck moving mechanism for moving said main chuck toward said probe card, thereby bringing electrodes of the object to be inspected placed on said main chuck and said probes into electrical contact with each other; and
- a tester connected to said probes to measure the electrical characteristics of the inspection item,
- indexing of the inspection item, electrical contact between the electrodes of the object to be inspected and said probes, and measurement of the electrical characteristics of the inspection item being repeatedly performed, wherein
  - either one of said alignment mechanism and said main chuck moving mechanism comprises a card contact correction processing mechanism for correcting misalignment of said probe card and said probes prior to each electrical contact which is performed repeatedly during a process in which said probe card and said probes are controlled to reach the predetermined temperature.

19. An apparatus according to claim 18, wherein said card contact correction processing mechanism comprises
- a correction mechanism provided to said alignment mechanism to correct misalignment of said probe card and said probes in the X, Y, and θ directions prior to each electrical contact which is performed repeatedly in the process during which said probe card and said probes are controlled to reach the predetermined temperature, and
- a correction mechanism provided to said main chuck moving mechanism to correct misalignment of said probe card and said probes in the Z direction prior to each electrical contact which is performed repeatedly during the process.

20. An apparatus according to claim 18, wherein said card contact correction processing mechanism comprises
- a card contact correction setting mechanism for determining whether misalignment of said probe card and said probes is to be corrected prior to inspection of the first inspection item,
- a misalignment correction end condition setting mechanism for setting misalignment correction end conditions serving as a criterion concerning whether correction of misalignment is to be ended prior to inspection of each of a second and following inspection items,
- a misalignment correction condition storage mechanism for storing a preset content set by said card contact correction setting mechanism and said misalignment correction end condition setting mechanism, and
- a card contact correction processing mechanism for correcting misalignment of said probe card and said probes in accordance with the preset content stored in said misalignment correction condition storage mechanism.

21. An apparatus according to claim 20, wherein said card contact correction processing mechanism has a misalignment correction execute processing mechanism for checking current positions of said probe card and said probes prior to performing inspection of each of second and following inspection items and correcting misalignment of said probes in accordance with a check content.

22. An apparatus according to claim 20, wherein the misalignment correction end conditions are set on the basis of determination as to whether an amount of displacement from positions of said tips of said probes in the last inspection to current positions of said tips falls within an allowable range.

23. An apparatus according to claim 20, wherein the misalignment correction end conditions are set on the basis of determination as to whether a time required for inspection until a last chip inspection time exceeds a minimum inspection time required for said probe card and said probes to reach the predetermined temperature.

24. An apparatus according to claim 20, wherein the misalignment correction end conditions are set on the basis of
- determination as to whether an amount of displacement from positions of said tips of said probes in the last inspection to current positions of said tips falls within an allowable range,
- determination as to whether a time required for inspection until a last chip inspection time exceeds a minimum inspection time required for said probe card and said probes to reach the predetermined temperature, and
- the number of times it is determined in the above two determinations simultaneously and continuously that the amount of displacement of the positions of said tips of said probes falls within the allowable range and that the time required for inspection until the last chip inspection time exceeds the minimum inspection time.

25. An apparatus according to claim 20, wherein said card contact correction setting mechanism and said misalignment correction end condition setting mechanism comprise
- a sensor for detecting the temperature of said probe card and said probes, and
- a mechanism for determining whether misalignment is to be corrected on the basis of the detected temperature.

* * * * *